(12) United States Patent
Yano et al.

(10) Patent No.: US 8,158,974 B2
(45) Date of Patent: Apr. 17, 2012

(54) SEMICONDUCTOR DEVICE, POLYCRYSTALLINE SEMICONDUCTOR THIN FILM, PROCESS FOR PRODUCING POLYCRYSTALLINE SEMICONDUCTOR THIN FILM, FIELD EFFECT TRANSISTOR, AND PROCESS FOR PRODUCING FIELD EFFECT TRANSISTOR

(75) Inventors: Koki Yano, Chiba (JP); Kazuyoshi Inoue, Chiba (JP)

(73) Assignee: Idemitsu Kosan Co., Ltd., Tokyo (JP)

( * ) Notice: Subject to any disclaimer, the term of this patent is extended or adjusted under 35 U.S.C. 154(b) by 197 days.

(21) Appl. No.: 12/532,259

(22) PCT Filed: Mar. 21, 2008

(86) PCT No.: PCT/JP2008/055225
§ 371 (c)(1),
(2), (4) Date: Jan. 19, 2010

(87) PCT Pub. No.: WO2008/117739
PCT Pub. Date: Oct. 2, 2008

(65) Prior Publication Data
US 2010/0140609 A1    Jun. 10, 2010

(30) Foreign Application Priority Data

Mar. 23, 2007 (JP) ................. 2007-076811
Mar. 26, 2007 (JP) ................. 2007-078997

(51) Int. Cl.
*H01L 29/12* (2006.01)
(52) U.S. Cl. ........... 257/43; 257/E21.461; 257/E29.094; 438/99
(58) Field of Classification Search ............ 257/43, 257/E21.461, E29.094; 438/99
See application file for complete search history.

(56) References Cited

U.S. PATENT DOCUMENTS

| | | | |
|---|---|---|---|
| 5,744,864 | A | 4/1998 | Cillessen et al. |
| 6,563,174 | B2 | 5/2003 | Kawasaki et al. |
| 7,189,992 | B2 | 3/2007 | Wager, III et al. |
| 7,262,463 | B2 | 8/2007 | Hoffman |
| 7,339,187 | B2 | 3/2008 | Wager, III et al. |
| 7,507,357 | B2 | 3/2009 | Abe et al. |
| 7,564,055 | B2 | 7/2009 | Hoffman |

(Continued)

FOREIGN PATENT DOCUMENTS

JP    60 198861 A    10/1985

(Continued)

OTHER PUBLICATIONS

The International Bureau of WIPO. "International Preliminary Report on Patentability and Written Opinion." PCT/JP2008/055225. Authorized Officer: Yoshiko Kuwahara. Applicant: IDEMITSU KOSAN Co., Ltd. Mailed Sep. 29, 2009.

(Continued)

*Primary Examiner* — Zandra Smith
*Assistant Examiner* — Marvin Payen
(74) *Attorney, Agent, or Firm* — Millen, White, Zelano & Branigan, P.C.

(57) ABSTRACT

An object of the present invention is to provide a novel semiconductor device which is excellent in stability, uniformity, reproducibility, heat resistance, durability and the like, and can exert excellent transistor properties. The semiconductor device is a thin-film transistor, and this thin-film transistor uses, as an active layer, a polycrystalline oxide semiconductor thin film containing In and two or more metals other than In and having an electron carrier concentration of less than $1\times10^{18}/cm^3$.

10 Claims, 10 Drawing Sheets

U.S. PATENT DOCUMENTS

| | | |
|---|---|---|
| 7,575,698 B2 | 8/2009 | Abe et al. |
| 2003/0047785 A1 | 3/2003 | Kawasaki et al. |
| 2003/0218221 A1 | 11/2003 | Wager, III et al. |
| 2003/0218222 A1 | 11/2003 | Wager, III et al. |
| 2004/0137280 A1 | 7/2004 | Abe et al. |
| 2005/0017244 A1 | 1/2005 | Hoffman |
| 2005/0017302 A1 | 1/2005 | Hoffman |
| 2006/0113536 A1 | 6/2006 | Kumomi et al. |
| 2006/0113565 A1 | 6/2006 | Abe et al. |
| 2007/0141784 A1 | 6/2007 | Wager, III et al. |
| 2007/0194379 A1 | 8/2007 | Hosono et al. |
| 2007/0267699 A1 | 11/2007 | Hoffman |
| 2008/0108198 A1 | 5/2008 | Wager, III et al. |
| 2009/0127519 A1 | 5/2009 | Abe et al. |

FOREIGN PATENT DOCUMENTS

| | | | |
|---|---|---|---|
| JP | 60 198861 W | 10/1985 | |
| JP | 7 235219 A | 9/1995 | |
| JP | 7 235219 W | 9/1995 | |
| JP | 11 505377 A | 5/1999 | |
| JP | 2003 86808 A | 3/2003 | |
| JP | 2004 207221 A | 7/2004 | |
| JP | 2004 273614 A | 9/2004 | |
| JP | 2004 273614 W | 9/2004 | |
| JP | 2006-005116 A | 1/2006 | |
| JP | 2006-005116 W | 1/2006 | |
| JP | 2006 502597 A | 1/2006 | |
| JP | 2006 165527 A | 6/2006 | |
| JP | 2006 165527 W | 6/2006 | |
| JP | 2006 165528 A | 6/2006 | |
| JP | 2006 165532 A | 6/2006 | |
| JP | 2006 528843 A | 12/2006 | |
| WO | 9706554 A2 | 2/1997 | |
| WO | 2004038757 A2 | 5/2004 | |
| WO | 2005015643 A1 | 2/2005 | |
| WO | 2005088726 A1 | 2/2005 | |
| WO | PCTJP2008055225 R | 5/2008 | |

OTHER PUBLICATIONS

Jung, Sik Yeon et al. "Influence of DC magnetron sputtering parameters on the properties of amorphous indium zinc oxide thin film." (Thin Solid Films), Nov. 24, 2003, 63-71,445:1.

Nakazawa, Hiromi et al. "The electronic properties of amorphous and crystallized In2O3 films." (Journal of Applied Physics). Nov. 1, 2006, 100:9.

Yeom, Hyo-Yeong et al. "A study of the effect of process oxygen on stress evolution in d.c. magnetron-deposited tin-deposited tin-doped indium oxide." (Thin Solid Films), May 22, 2002, 17-22, 411:1.

FIG. 4

| | | | Example | | | | | | | | | | | | | | Comparative Example | | | | | |
|---|---|---|---|---|---|---|---|---|---|---|---|---|---|---|---|---|---|---|---|---|---|---|
| | | | 1 | 2 | 3 | 4 | 5 | 6 | 7 | 8 | 9 | 10 | 11 | 12 | 13 | 1 | 2 | 3 | 4 | 5 | 6 |
| Film forming process | | | RF magnetron sputtering | RF magnetron sputtering | RF magnetron sputtering | RF magnetron sputtering | RF magnetron sputtering | RF magnetron sputtering | RF magnetron sputtering | RF magnetron sputtering | RF magnetron sputtering | RF magnetron sputtering | RF magnetron sputtering | RF magnetron sputtering | RF magnetron sputtering | DC magnetron sputtering | DC magnetron sputtering | DC magnetron sputtering | DC magnetron sputtering | RF magnetron sputtering | RF magnetron sputtering |
| Film forming conditions | Substrate temperature[°C] | | 25 | 25 | 25 | 25 | 25 | 25 | 25 | 25 | 25 | 25 | 25 | 25 | 25 | 25 | 25 | 25 | 25 | 25 | 25 |
| | Reached pressure[×$10^{-4}$Pa] | | 1 | 1 | 1 | 1 | 1 | 1 | 1 | 1 | 1 | 1 | 1 | 1 | 1 | 10 | 10 | 10 | 10 | 10 | 10 |
| | Atmospheric gas | | Ar:100% | Ar:100% | Ar:100% | Ar:100% | Ar:100% | Ar:100% | Ar:100% | Ar:100% | Ar:100% | Ar:100% | Ar:100% | Ar:100% | Ar:100% | Ar:100% | Ar:100% | Ar:100% | Ar:92% $H_2$:8% | Ar:96% $O_2$:4% | Ar:95% $O_2$:5% |
| | Total pressure[Pa] | | 0.1 | 0.1 | 0.1 | 0.1 | 0.1 | 0.1 | 0.1 | 0.1 | 0.1 | 0.1 | 0.1 | 0.1 | 0.1 | 0.2 | 0.2 | 0.2 | 0.2 | 0.2 | 0.2 |
| | Oxygen partial pressure[×$10^{-3}$Pa] | | 0 | 0 | 0 | 0 | 0 | 0 | 0 | 0 | 0 | 0 | 0 | 0 | 0 | 0 | 0 | 0 | 0 | 8 | 10 |
| Film composition atomic ratio | In/(In+X) | | 0.93 | 0.93 | 0.93 | 0.93 | 0.93 | 0.93 | 0.93 | 0.93 | 0.93 | 0.93 | 0.93 | 0.93 | 0.93 | 1.00 | 0.00 | 0.95 | 0.95 | 0.55 | 0.55 |
| | X/(In+X) | | 0.07 | 0.07 | 0.07 | 0.07 | 0.07 | 0.07 | 0.07 | 0.07 | 0.07 | 0.07 | 0.07 | 0.07 | 0.07 | 0.00 | 1.00 | 0.05 | 0.05 | 0.45 | 0.45 |
| | Breakdown of X | | Zn 0.06 | Zn 0.06 | Zn 0.06 | Zn 0.06 | Zn 0.06 | Zn 0.06 | Zn 0.06 | Zn 0.06 | Zn 0.06 | Zn 0.069 | Zn 0.069 | Zn 0.060 | Zn 0.060 | Zn | Zn | Zn | Zn | Zn | Zn |
| | | | Mg 0.01 | Cu 0.01 | Ni 0.01 | Ga 0.01 | Al 0.01 | Ce 0.01 | Dy 0.01 | Er 0.01 | Yb 0.01 | Ge 0.001 | Ti 0.001 | Mg 0.009 | Mg 0.060 | | | | | | |
| | | | | | | | | | | | | | | Sn 0.001 | Dy 0.009 | | | | | | |
| | | | | | | | | | | | | | | | Ge 0.001 | | | | | | |
| Oxidation treatment | | | Atmospheric heat treatment 300°C 2 hours | Atmospheric heat treatment 300°C 2 hours | Atmospheric heat treatment 300°C 2 hours | Atmospheric heat treatment 300°C 2 hours | Atmospheric heat treatment 300°C 2 hours | Atmospheric heat treatment 300°C 2 hours | Atmospheric heat treatment 300°C 2 hours | Atmospheric heat treatment 300°C 2 hours | Atmospheric heat treatment 300°C 2 hours | Atmospheric heat treatment 300°C 2 hours | Atmospheric heat treatment 300°C 2 hours | Atmospheric heat treatment 300°C 2 hours | Atmospheric heat treatment 300°C 2 hours | Atmospheric heat treatment 300°C 2 hours | Atmospheric heat treatment 300°C 2 hours | None | None | None | None |
| Properties of semiconductor thin film | Crystallinity (X-ray diffraction) | | Poly-crystalline | Poly-crystalline | Poly-crystalline | Poly-crystalline | Poly-crystalline | Poly-crystalline | Poly-crystalline | Poly-crystalline | Poly-crystalline | Poly-crystalline | Poly-crystalline | Poly-crystalline | Poly-crystalline | Poly-crystalline | Poly-crystalline | Amorphous | Amorphous | Amorphous | Amorphous |
| | Hole measurement | Carrier concentration [cm$^{-3}$] | 3×$10^{14}$ | 3×$10^{14}$ | 3×$10^{14}$ | 3×$10^{14}$ | 3×$10^{14}$ | 3×$10^{14}$ | 3×$10^{14}$ | 3×$10^{14}$ | 3×$10^{14}$ | 3×$10^{14}$ | 3×$10^{14}$ | 3×$10^{14}$ | 3×$10^{14}$ | 1×$10^{18}$ | 6×$10^{17}$ | 3×$10^{20}$ | 7×$10^{20}$ | 1.1×$10^{16}$ | 9×$10^{15}$ |
| | | Hole mobility [cm$^2$/Vs] | 5 | 5 | 5 | 3 | 3 | 4 | 4 | 4 | 4 | 5 | 5 | 6 | 5 | 28 | 1 | 35 | 17 | 3 | 2 |
| | Specific resistance (four terminal method) [Ωcm] | | 1100 | 1100 | 1100 | 2300 | 2300 | 1300 | 1300 | 1300 | 1300 | 1100 | 1100 | 900 | 1100 | 0.22 | 10 | 0.0006 | 0.00053 | 190 | 350 |
| | Energy band gap (eV) | | 3.7 | 3.2 | 3.2 | 3.6 | 3.6 | 3.5 | 3.5 | 3.5 | 3.5 | 3.5 | 3.5 | 3.7 | 3.8 | 4.1 | 3.3 | 4.2 | 4.2 | 3.7 | 3.8 |
| | PAN resistance | | ○ | ○ | ○ | ○ | ○ | ○ | ○ | ○ | ○ | ○ | ○ | ○ | ○ | ○ | × | × | × | × | × |
| | Heat resistance | | ○ | ○ | ○ | ○ | ○ | ○ | ○ | ○ | ○ | ○ | ○ | ○ | ○ | ○ | ○ | ○ | ○ | × | × |

FIG. 7

| | | | Example | | | Comparative Example | | |
|---|---|---|---|---|---|---|---|---|
| | | | 14 | 15 | 16 | 7 | 8 | 9 |
| Film forming process | | | RF magnetron sputtering | RF magnetron sputtering | RF magnetron sputtering | RF magnetron sputtering | RF magnetron sputtering | RF magnetron sputtering |
| Substrate position | | | C | A | C | B | B | A |
| Film forming conditions | Substrate temperature[°C] | | 25 | 25 | 25 | 270 | 270 | 25 |
| | Reached pressure[×10⁻⁴Pa] | | 0.1 | 0.1 | 0.1 | 10 | 10 | 0.1 |
| | Atmospheric gas | | Ar:100% | Ar:100% | Ar:100% | Ar:100% | Ar:100% | Ar:100% |
| | Total pressure[Pa] | | 0.1 | 0.1 | 0.1 | 0.4 | 0.4 | 0.4 |
| | Oxygen partial pressure[×10⁻³Pa] | | 0 | 0 | 0 | 0 | 0 | 0 |
| Film composition atomic ratio | In/(In + X) | | 0.93 | 0.93 | 0.93 | 0.93 | 0.93 | 0.50 |
| | X/(In + X) | | 0.07 | 0.07 | 0.07 | 0.07 | 0.07 | 0.50 |
| | X | | Zn | Zn | Mg | Zn | Zn | Zn |
| Heat treatment | | | Atmospheric heat treatment | Atmospheric heat treatment | Atmospheric heat treatment | None | Atmospheric heat treatment | Atmospheric heat treatment |
| | | | 280°C | 280°C | 280°C | | 280°C | 280°C |
| | | | 2 hours | 2 hours | 2 hours | | 2 hours | 2 hours |
| Properties of semiconductor thin film | X-ray diffraction | Crystallinity | Polycrystalline | Polycrystalline | Polycrystalline | Polycrystalline | Polycrystalline | Amorphous |
| | | Half value width(°) | 0.2 | 0.2 | 0.2 | 1 | 1 | - |
| | | I(222)/I(400) | <0.01 | >20 | <0.01 | 2 | 2 | - |
| | Hole measurement | Carrier concentration [cm⁻³] | $4\times10^{14}$ | $8\times10^{14}$ | $6\times10^{14}$ | $2\times10^{15}$ | $9\times10^{14}$ | $1\times10^{20}$ |
| | | Hole mobility [cm²/Vs] | 8 | 5 | 6 | 1 | 1 | 20 |
| | Specific resistance (four terminal method) [Ωcm] | | 2000 | 1600 | 1800 | 3200 | 3500 | 0.003 |
| | PAN resistance | | ○ | ○ | ○ | ○ | ○ | × |

FIG. 9
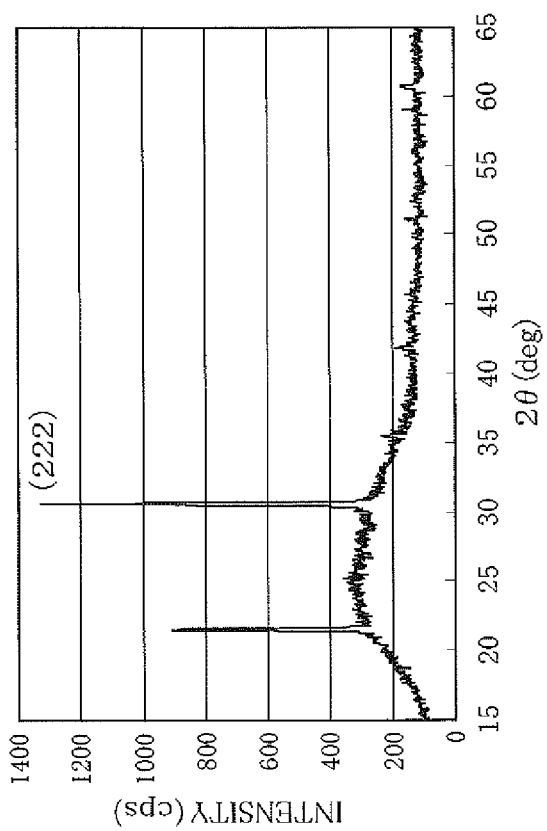
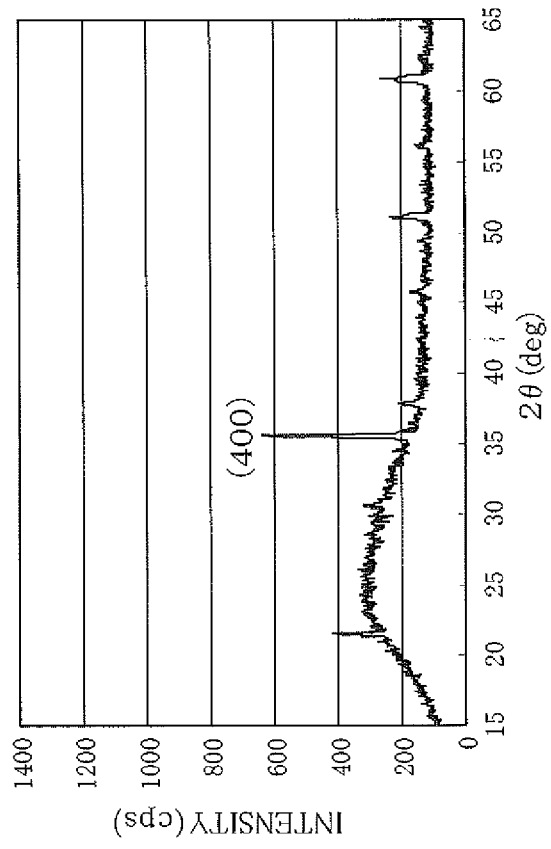

SEMICONDUCTOR DEVICE, POLYCRYSTALLINE SEMICONDUCTOR THIN FILM, PROCESS FOR PRODUCING POLYCRYSTALLINE SEMICONDUCTOR THIN FILM, FIELD EFFECT TRANSISTOR, AND PROCESS FOR PRODUCING FIELD EFFECT TRANSISTOR

TECHNICAL FIELD

The present invention relates to a semiconductor device, a polycrystalline semiconductor thin film, a process for producing a polycrystalline semiconductor thin film, a field effect transistor, and a process for producing a field effect transistor.

In particular, the present invention relates to a semiconductor device which uses, as a semiconductor, a crystalline oxide containing In and two or more metals other than In and having a predetermined electron carrier concentration. Moreover, the present invention relates to a polycrystalline semiconductor thin film having a high crystallinity and including crystals aligned in a predetermined direction, a process for producing the polycrystalline semiconductor thin film, a field effect transistor, and a process for producing the field effect transistor.

BACKGROUND ART

Field effect transistors are broadly used as unit electron elements of semiconductor memory integrated circuits, high-frequency signal amplification elements, liquid crystal driving elements and the like, and the transistors are electronic devices which have nowadays been put to practical use in the largest quantities.

Above all, with the remarkable development of the display devices in recent years, in not only liquid crystal display devices (LCDs) but also various display devices such as electroluminescence display devices (ELs) and field emission displays (FEDs), thin-film transistors (TFTs) are used in large quantities as switching elements for applying a driving voltage to display elements to drive the display devices.

Moreover, as the material of the transistors, a silicon semiconductor compound is most broadly used. Usually, for high-frequency amplification elements, elements for integrated circuits and the like which require a high speed operation, a silicon single crystal is used, and for the liquid crystal driving elements and the like, amorphous silicon is used for the requirement of a area enlargement of the display device.

Furthermore, in the case of a crystalline silicon-based thin film, a high temperature of, for example, 800° C. or more is required at its crystallization, and hence it is difficult to form the thin film on a glass substrate or an organic substrate. Therefore, the formation of the thin film is possible only on an expensive substrate such as a silicon wafer or quartz having a high heat resistance. In addition, for the production of the film, a large amount of energy and many steps are necessary.

Furthermore, in the crystalline silicon-based thin film, the element constitution of the TFT is usually limited to a top gate constitution, and hence it has been difficult to decrease the number of masks or the like, which disturbs the decrease of production costs.

On the other hand, an amorphous silicon semiconductor (amorphous silicon) which can be formed at a comparatively low temperature has a low switching speed as compared with a crystalline semiconductor. Therefore, when the amorphous silicon is used as the switching element for driving the display device, such an element cannot follow up the display of a dynamic image at a high speed on occasion.

Furthermore, when a semiconductor active layer is irradiated with visible light, the layer exerts conductivity, and a leakage current might be generated to cause malfunctions. Thus, properties as the switching element deteriorate on occasion. To solve this problem, a method of providing a light block layer which blocks the visible light is known, and as the light block layer, for example, a metal thin film is used. However, when the light block layer made of the metal thin film is provided, not only the steps increase, but also the layer has a floating potential. Therefore, the light block layer needs to be set to a ground level, and also in this case, a parasitic capacity is generated.

It is to be noted that at present, as the switching element for driving the display device, an element using a silicon-based semiconductor film has been a mainstream. This is because such a silicon thin film has various satisfactory performances such as a high stability, an excellent processability and a high switching speed. Moreover, such a silicon-based thin film is usually produced by a chemical vapor deposition (CVD) process.

Moreover, some of conventional thin-film transistors (TFTs) have an inversely staggered structure in which a gate electrode, a gate insulating layer, a semiconductor layer of hydrogenated amorphous silicon (a-Si:H) or the like, a source electrode and a drain electrode are laminated on a substrate of glass or the like. This kind of thin-film transistor is used as the driving element for not only an image sensor but also a flat panel display typified by an active matrix liquid crystal display in the field of a large area device. In these applications, even in the elements using conventional amorphous silicon, the speedup of an operation has been demanded with the advancement of functions.

Under such a situation, in recent years, a transparent semiconductor thin film made of a metal oxide has received attention as a thin film having an excellent stability as compared with the silicon-based semiconductor thin film (see Patent Documents 1 to 6).

In general, the electron mobility of oxide crystals increases as the overlap of the s-orbits of metal ions increases. The oxide crystals of Zn, In and Sn each having a large atomic number have a large electron mobility of 0.1 to 200 $cm^2/Vs$. Furthermore, the oxide has ionic bonds between oxygen and metal ions, and hence it does not have any directionality of the chemical bonds. Hence, even in an amorphous state in which the direction of the bonds is nonuniform, the oxide can possess an electron mobility close to that of a crystalline state. In consequence, even if the metal oxide is amorphous, a transistor having a high field effect mobility can be produced, in contrast to the Si-based semiconductor. There have been investigated various semiconductor devices utilizing these advantages and made of the crystalline/amorphous metal oxide containing Zn, In and Sn, circuits using the semiconductor devices, and the like.

It is to be noted that the technology of a transparent conductive film obtained by adding a positive bivalent element to indium and (see Non-Patent Document 1), technologies concerning the crystal configuration of ITO (see Non-Patent Documents 2 and 3) and the like are investigated.

Moreover, various technologies are disclosed in which an amorphous transparent semiconductor film made of a metal oxide such as indium oxide, gallium oxide or zinc oxide is produced by, for example, a pulse laser deposition (PLD) process, and a thin-film transistor is driven (see Patent Documents 7 to 11).

Patent Document 1: JP-A-2006-165527
Patent Document 2: JP-A-11-505377
Patent Document 3: JP-A-60-198861
Patent Document 4: JP-A-2006-528843
Patent Document 5: JP-A-2006-502597
Patent Document 6: WO 2005/088726
Patent Document 7: JP-A-2003-86808
Patent Document 8: JP-A-2004-273614
Patent Document 9: JP-A-7-235219
Patent Document 10: JP-A-2006-165528
Patent Document 11: JP-A-2006-165532
Non-Patent Document 1: Thin Solid Films 445 (2003) 63 to 71
Non-Patent Document 2: Thin Solid Films 411 (2002) 17 to 22
Non-Patent Document 3: Journal of Applied Physics 100, 093706 (2006)

DISCLOSURE OF THE INVENTION

Problem to be Solved by the Invention

However, among the above transparent semiconductor thin films made of the metal oxides especially the transparent semiconductor thin film formed by crystallizing zinc oxide at a high temperature has a small field effect mobility of about 1 $cm^2/V\cdot sec$ and also has a small on-off ratio. In addition, a leakage current is easily generated, and hence it has been difficult to industrially put the thin film to practical use.

Moreover, a large number of crystalline oxide semiconductors using zinc oxide have been investigated. However, in a case where the film is formed by a sputtering process which is industrially usually performed, the following problems occur.

That is, the performance of a TFT might deteriorate owing to a small mobility, a small on-off ratio, a large leakage current, ambiguous pinch-off and the easy occurrence of a normally-on state.

Moreover, a production process and a use environment are restricted owing to poor resistance to chemicals and difficulty of wet etching. Furthermore, problems of industrialization are also present. For example, to raise the performance, the film needs to be formed at a high pressure, a film forming speed is low, and a high temperature treatment at 700° C. or more is required. In addition, the constitution of a TFT element is restricted. For example, a TFT performance such as an electrolytic mobility in a bottom gate constitution is low, and to raise the performance, a film thickness is required to be 50 nm or more in a top gate constitution.

Moreover, the properties of the amorphous transparent semiconductor thin film noticeably change with an elapse of time and by heat. Therefore, there is a problem that when the film is used for a long time, its threshold voltage noticeably changes. Especially in a process for producing a liquid crystal panel, the heat of 250° C. or more, 300° C. or more at times is applied to the film on occasion. The thermal change of the properties of the film remarkably disturbs the industrialization thereof. This is supposed owing to the facts that the number of carriers is excessively large, the film is amorphous, or oxygen is forcibly contained in the film by raising an oxygen partial pressure during the film formation, so that oxygen easily moves and a carrier density easily changes.

Furthermore, in the amorphous transparent semiconductor thin film, a large amount of oxygen is often introduced during the film formation, and hence it is difficult to control the film formation. Moreover, the film is easily affected by the change of the carrier density with the elapse of time and the change of an ambient temperature. Therefore, the oxygen partial pressure during the film formation needs to be accurately controlled. Accordingly, for the industrialization of the amorphous transparent semiconductor thin film, there are problems of reproducibility, stability and large area uniformity, and it has been difficult to apply the film to a large-sized liquid crystal display or the like.

Furthermore, since being amorphous, the film has a low resistance to a chemical such as an etching solution typified by PAN, and hence the wet etching for metal wiring lines on a semiconductor film cannot be carried out. In addition, there is a problem that the film has a large refractive index, and hence the transmittance of a multilayered film easily decreases. Moreover, owing to being amorphous, the film adsorbs oxygen, water or the like in an atmospheric gas, with the result that the electric properties thereof change. In consequence, a yield might decrease.

On the other hand, a crystalline film of indium oxide, especially a polycrystalline film easily generates an oxygen deficit, and therefore, it has been considered that even by increasing the oxygen partial pressure during the film formation or by carrying out an oxidation treatment or the like, it is difficult to set the carrier density to a value of less than $1 \times 10^{18}$ $cm^{-3}$. Accordingly, attempts to use the film as the semiconductor film or the TFT have hardly been made.

Moreover, an oxide thin film containing indium and a positive bivalent element such as Zn or Mg, and the crystallization of the film by the heat treatment have been investigated, but mainly for an amorphous transparent conductive film, the investigation has been made. However, for the application of a polycrystalline film including decreased carriers to a field effect transistor, any investigation has not been made (see Non-Patent Document 1).

Furthermore, the crystal configurations and electric properties of polycrystals made of indium oxide-tin oxide and polycrystals made of indium oxide have also been investigated, but there has not been investigated a relation between the field effect transistor using, as an active layer, a polycrystalline oxide thin film containing indium and a positive bivalent element such as Zn or Mg and the crystal configuration of the polycrystalline film (see Non-Patent Documents 2 and 3).

The present invention has been developed in view of the above situation, and an object thereof is to provide a novel semiconductor device in which a crystalline oxide containing indium and two or more metals other than indium is used as a semiconductor to improve stability, uniformity, reproducibility, heat resistance, durability and the like, and to exert excellent transistor properties.

Moreover, another object of the present invention is to provide a polycrystalline semiconductor thin film in which the crystal configuration of a polycrystalline thin film containing indium, a positive bivalent element and oxygen is made appropriate to improve transistor properties, reliability, productivity, large area uniformity and reproducibility, and to heighten fineness. The further objects are to provide a process for producing the polycrystalline semiconductor thin film, a field effect transistor, and a process for producing the field effect transistor.

Means for Solving the Problem

To achieve the above objects, a semiconductor device of the present invention uses a crystalline oxide as a semiconductor, wherein the crystalline oxide contains In and two or more metals other than In, and the crystalline oxide has an electron carrier concentration of less than $1 \times 10^{18}/cm^3$.

Thus, the crystalline oxide having excellent properties as compared with an amorphous oxide is used as the semiconductor, whereby the stability, uniformity, reproducibility, heat resistance, durability, chemical resistance and the like of the semiconductor device can be improved. Moreover, since the oxide contains indium and two or more metals other than indium, it is possible to realize a semiconductor thin film having a low carrier concentration, a high Hall mobility and a large energy band gap, and it is possible to provide a novel semiconductor device having excellent properties.

It is to be noted that examples of the semiconductor device include a semiconductor element, a semiconductor component, a semiconductor apparatus and an integrated circuit.

Furthermore, examples of the crystalline oxide include a single crystal oxide, an epitaxial oxide and a polycrystalline oxide, but the polycrystalline oxide is preferable, because it can industrially easily be produced.

Preferably, a relation between the number (=[In]) of the atoms of In contained in the crystalline oxide and the sum (=[X]) of the atoms of the two or more metals other than In satisfies [X]/([X]+[In])=0.0001 to 0.13.

In this case, the electron carrier concentration can be set to be less than $1 \times 10^{18}/cm^3$. That is, the present inventors have produced a crystal film containing In as a main component and two or more metals as dopants, and they have found that when dopant concentrations and post-treatment conditions are controlled, the electron carrier concentration can be set to be less than about $1 \times 10^{18}/cm^3$.

Preferably, the crystalline oxide is a crystalline oxide in which when at least the condition of [X]/([X]+[In]) is changed, an electron mobility of the crystalline oxide with respect to the electron carrier concentration thereof increases logarithmically proportionally to the increase of the electron carrier concentration in a predetermined range.

In this case, semiconductor properties can easily be set, and the added value of the semiconductor can be increased.

Preferably, the two or more metals other than In are a positive bivalent metal and a positive tetravalent metal.

Thus, in a case where the positive bivalent metal and the positive tetravalent metal are added to the oxide containing a positive trivalent metal of In as the main component, valences are better balanced than a case where the oxide contains the positive bivalent metal only. Therefore, it can be expected that the state of the semiconductor device is stabilized to improve the reliability thereof.

It is to be noted that the positive bivalent metal is an element capable of taking a positive bivalent value as a valence in an ion state, the positive trivalent metal is an element capable of taking a positive trivalent value as a valence in an ion state, and the positive tetravalent metal is an element capable of taking a positive tetravalent value as a valence in an ion state.

Preferably, the positive bivalent metal is at least one element selected from the group consisting of Zn, Mg, Cu, Ni, Co, Ca and Sr, and the positive tetravalent metal is at least one element selected from the group consisting of Sn, Ge, Si, Ti, C, Zr and Hf. Preferably, a relation among the number (=[In]) of the atoms of In, the number (=[M2]) of the atoms of the positive bivalent metal and the number (=[M4]) of the atoms of the positive tetravalent metal contained in the crystalline oxide satisfies

[M2]/([M2]+[M4]+[In])=0.0001 to 0.13; and
[M4]/([M2]+[M4])=0.0001 to 0.3.

In this case, the electron carrier concentration can be set to be less than $1 \times 10^{18}/cm^3$.

Preferably, the two or more metals other than In are a positive bivalent metal and a positive trivalent metal.

Also in this case, it can be expected that the state of the semiconductor device is stabilized to improve the reliability thereof.

Preferably, the positive bivalent metal is at least one element selected from the group consisting of Zn, Mg, Cu, Ni, Co, Ca and Sr, and the positive trivalent metal is at least one element selected from the group consisting of Ga, Al, B, La, Ce, Pr, Nd, Sm, Eu, Gd, Tb, Dy, Ho, Er, Tm, Yb and Lu.

In this case, it can be expected that the state of the semiconductor device is further stabilized to improve the reliability thereof.

Preferably, both of the two or more metals other than In are positive bivalent metals.

Also in this case, it can be expected that the state of the semiconductor device is stabilized to improve the reliability thereof.

Preferably, the two or more metals other than In are one set selected from the group consisting of Zn and Mg, Zn and Cu, Zn and Co, Zn and Ni, Zn and Ca, and Zn and Sr.

In this case, it can be expected that the state of the semiconductor device is further stabilized to improve the reliability thereof.

Preferably, the concentration of Li, Na and K in the polycrystalline oxide is 1000 ppm or less.

In this case, when a transistor is driven for a long time, the change of the properties thereof decreases, and the reliability thereof can be improved.

Preferably, the crystalline oxide has PAN resistance.

In this case, the degree of the freedom of production steps increases, and the semiconductor device can efficiently be produced.

Preferably, the crystalline oxide includes, as an impurity, at least one element selected from the group consisting of Ar, Kr, Xe, Ne and N.

In this case, the electron carrier concentration can easily be controlled.

Preferably, the crystalline oxide is used as an active layer of a thin-film transistor.

In this case, the stability, uniformity, reproducibility, heat resistance, durability, chemical resistance and the like of the thin-film transistor can be improved. Moreover, element properties can be improved. For example, even when the transistor is used for a long time, the shift amount of a threshold value is small, a field effect mobility and an on-off ratio are high, and an influence of irradiating light, for example, the generation of a leakage current or the like can be decreased. Furthermore, it is possible to provide the thin-film transistor which is excellent in large area uniformity and reproducibility.

To achieve the object, a polycrystalline semiconductor thin film of the present invention contains indium, a positive bivalent element and oxygen, has a crystallinity with a locking curve half value width of 1° or less according to an X-ray diffraction method, and has crystals aligned in a predetermined direction.

In this case, when a polycrystalline oxide having excellent properties as compared with an amorphous oxide is used as a semiconductor, the stability, uniformity, reproducibility, heat resistance, durability, chemical resistance and the like of the semiconductor device can be improved. Moreover, the crystals are aligned in the predetermined direction, whereby the set range of the electron mobility can be enlarged, and the added value of the polycrystalline semiconductor thin film can be improved. Furthermore, the high fineness of the semiconductor element can be provided. In addition, the polycrystalline thin film contains indium, the positive bivalent element and oxygen, whereby it is possible to realize a semiconductor thin film having excellent semiconductor properties such as a low electron carrier concentration, a high electron mobility and a large energy band gap.

Preferably, an X-ray diffraction pattern in the X-ray diffraction method is the pattern of Vicks byte structure, and a diffraction intensity ratio (I(222)/I(400)) between a (222) peak intensity (I(222)) and a (400) peak intensity (I(400)) is I(222)/I(400)<1.0.

In this case, when the polycrystalline semiconductor thin film is applied to the transistor, it is possible to avoid disadvantages that the field effect mobility and on-off ratio of the transistor might be low, the gate leakage current and off current thereof might increase, and the reliability thereof might deteriorate.

Furthermore, a crystalline film is what indicates a specific diffraction line in X-ray diffraction, and the polycrystalline film is what indicates an intensity ratio different from a registered peak intensity ratio.

Preferably, an X-ray diffraction pattern in the X-ray diffraction method is the pattern of Vicks byte structure, and a diffraction intensity ratio (I(222)/I(400)) between a (222) peak intensity (I(222)) and a (400) peak intensity (I(400)) is I(222)/I(400)>10.

In this case, when the polycrystalline semiconductor thin film is applied to the transistor, it is possible to avoid disadvantages that the field effect mobility and on-off ratio of the transistor might be low, the gate leakage current and off current thereof might increase, and the reliability thereof might deteriorate.

Preferably, a relation between the number (=[In]) of the atoms of indium and the number (=[X]) of the atoms of the positive bivalent element satisfies [X]/([X]+[In])=0.0001 to 0.13.

In this case, the electron carrier concentration can be set to be less than $1 \times 10^{18}/cm^3$.

It is to be noted that the positive bivalent element is an element capable of taking a positive bivalent value as the valence in the ion state.

Preferably, the positive bivalent element is one or more elements selected from the group consisting of zinc, magnesium, copper, cobalt, nickel, calcium and strontium.

In this case, the electron carrier concentration can effectively be controlled.

Preferably, the positive bivalent element is zinc. In this case, a transmittance and a band gap of the thin film can be increased, and in addition, etching residues can be decreased.

Preferably, the polycrystalline semiconductor thin film contains a positive tetravalent element in an amount smaller than that of the positive bivalent element.

In this case, the valence is balanced, so that the positive bivalent element in the oxide of indium which is the positive trivalent element can be stabilized, and the reliability and uniformity can be improved.

Preferably, the polycrystalline semiconductor thin film is insoluble in a phosphoric acid-based etching solution (PAN), and soluble in an oxalic acid-based etching solution.

In this case, a semiconductor device such as the thin-film transistor can be produced by using simple wet etching, and the productivity and economical efficiency thereof can be improved.

Moreover, to achieve the above object, a process for producing a polycrystalline semiconductor thin film of the present invention is a process for producing the polycrystalline semiconductor thin film which contains indium, a positive bivalent element and oxygen, and the thin film has a crystallinity with a locking curve half value width of 1° or less in an X-ray diffraction method, and the are aligned in a predetermined direction. The process comprises forming an amorphous film at a substrate temperature of 150° C. or less, and a step of crystallizing the amorphous film at a temperature above 150° C. and not more than 500° C. to produce the polycrystalline semiconductor thin film.

In this case, the amorphous film can securely be formed, and during the crystallization, an oxygen deficit amount and a crystallinity can effectively be controlled.

Furthermore, to achieve the above object, a field effect transistor of the present invention uses, as an active layer, a polycrystalline semiconductor thin film which contains indium, a positive bivalent element and oxygen, and the thin film has a crystallinity with a locking curve half value width of 1° or less in an X-ray diffraction method, and the are aligned in a predetermined direction.

In this case, the stability, uniformity, reproducibility, heat resistance, durability, chemical resistance and the like of the field effect transistor can be improved. Moreover, element properties can be improved. For example, even when the transistor is used for a long time, the shift amount of the threshold value is small, the field effect mobility and an on-off ratio are high, and the influence of the irradiating light, for example, the generation of the leakage current or the like can be decreased. Furthermore, it is possible to provide the field effect transistor which is excellent in large area uniformity and reproducibility.

In addition, to achieve the above object, a process for producing a field effect transistor of the present invention is a process for producing the field effect transistor which uses, as an active layer, a polycrystalline semiconductor thin film which contains indium, a positive bivalent element and oxygen, and the thin film has a crystallinity with a locking curve half value width of 1° or less in an X-ray diffraction method, and the are aligned in a predetermined direction. The process comprises forming an amorphous film as the active layer at a substrate temperature of 150° C. or less, and a step of crystallizing the amorphous film at a temperature above 150° C. and not more than 500° C. to produce the polycrystalline semiconductor thin film.

In this case, the amorphous film which becomes the polycrystalline semiconductor thin film can securely be formed, and during the crystallization, the oxygen deficit amount and the crystallinity can effectively be controlled.

BRIEF DESCRIPTION OF THE DRAWINGS

FIG. 4 shows a table indicating a film forming process, film forming conditions, a film composition atomic ratio, an oxidation treatment and the properties of semiconductor thin films in Examples 1 to 13 and Comparative Examples 1 to 6;

FIG. 7 shows a table indicating a film forming process, a substrate position, film forming conditions, a film composition atomic ratio, a heat treatment and the properties of semiconductor thin films in Examples 14 to 16 and Comparative Examples 7 to 9;

FIG. 9 shows graphs of the analysis results of X-ray crystal structures of polycrystalline oxide semiconductor thin films of Examples 14 and 15.

BEST MODE FOR CARRYING OUT THE INVENTION

One Embodiment of Semiconductor Device

Figure 1:
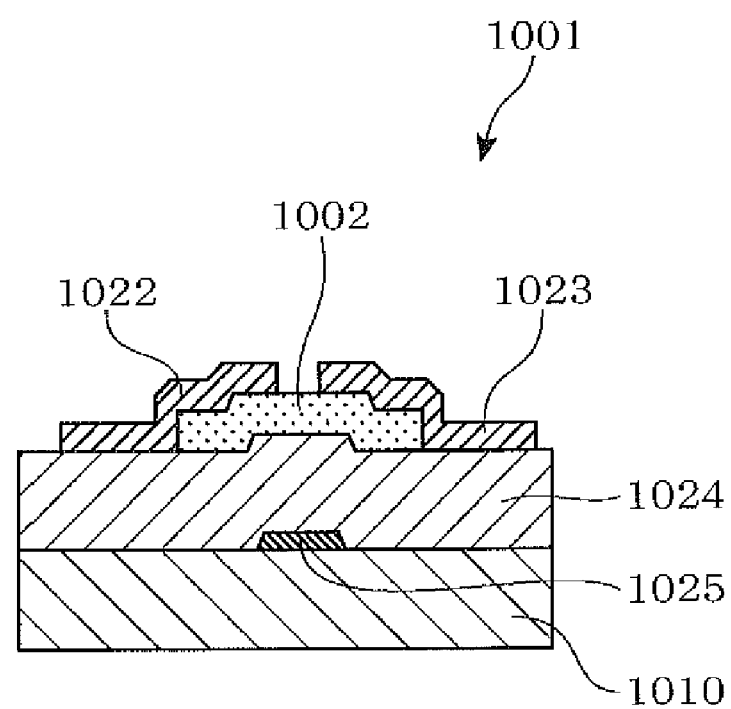
FIG. 1 shows a schematic sectional view of a main part of a thin-film transistor which is a semiconductor device according to one embodiment of the present invention.

FIG. 1 shows a schematic sectional view of a main part of a thin-film transistor which is a semiconductor device according to one embodiment of the present invention.

In FIG. 1, a bottom gate type thin-film transistor 1001 includes a gate electrode 1025 formed on a glass substrate 1010, a gate insulating film 1024 laminated on the gate electrode 1025 and the glass substrate 1010, a polycrystalline oxide semiconductor thin film 1002 as an active layer formed on the gate insulating film 1024 above the gate electrode 1025, and a source electrode 1022 and a drain electrode 1023 formed away from each other on the polycrystalline oxide semiconductor thin film 1002.

It is to be noted that the thin-film transistor 1001 is not limited to the above bottom gate type, and may be a thin-film transistor having any of various constitutions such as a top gate type and the like. A base material on which the thin-film transistor 1001 is formed is not limited to the glass substrate 1010, and may be, for example, a resin film having flexibility or the like.

In the thin-film transistor 1001, the polycrystalline oxide semiconductor thin film 1002 which is the crystalline oxide is used as the active layer. Moreover, the polycrystalline oxide semiconductor thin film 1002 contains In and two or more metals other than In, and has an electron carrier concentration of less than $1 \times 10^{18}/cm^3$.

The active layer (the semiconductor thin film) of the thin-film transistor 1001 is made of an oxide thin film including a crystalline material (i.e., the polycrystalline oxide semiconductor thin film 1002). In the case of the polycrystalline oxide semiconductor thin film 1002, when at least a part or all of the semiconductor thin film is made of the crystalline material, the carrier concentration can easily be decreased or controlled as compared with a semiconductor thin film made of an amorphous material. When the thin-film transistor is formed of such a crystalline semiconductor thin film, the operation of the thus formed thin-film transistor 1001 is stabilized, and in addition, the stability, uniformity, reproducibility, heat resistance, durability and the like thereof can also be improved.

It is to be noted that the crystalline material included in the thin film may be a single crystal or polycrystal material (including an epitaxial film), but a polycrystalline film is preferable, because the polycrystalline film is industrially easily produced and enables the area enlargement of a display device. Moreover, when the single crystal material is used, cracks might be generated owing to flexure or impact in a production process or during use, and also from this respect, the polycrystal material is preferable.

Moreover, in the present invention, a crystalline oxide 1021 is indicative of an oxide indicating a specific diffraction line in X-ray diffraction spectrum. On the other hand, the amorphous oxide is indicative of an oxide in which a halo pattern is observed and which does not indicate any specific diffraction line.

Furthermore, since the polycrystalline oxide semiconductor thin film 1002 contains indium and two or more metals other than indium, it is possible to realize a semiconductor thin film having a low carrier concentration, a high Hall mobility and a large energy band gap and to provide the novel thin-film transistor 1001 having excellent properties.

Here, preferably, a relation between the number (=[In]) of the atoms of In and the sum (=[X]) of the atoms of the two or more metals other than In contained in the polycrystalline oxide semiconductor thin film 1002 satisfies [X]/([X]+[In])= 0.0001 to 0.13. In this case, the electron carrier concentration can be set to be less than $1 \times 10^{18}/cm^3$.

This reason is that when an atomic ratio [X/(X+In)] is smaller than 0.0001, it might be difficult to set an electron carrier density to a value of less than $1 \times 10^{18}/cm^3$. On the other hand, when the atomic ratio [X/(X+In)] is larger than 0.13, the interface or surface of the thin film might easily be altered and become unstable. In addition, a crystallizing temperature becomes excessively high, and hence a high temperature is required for crystallizing the film, or the crystallization might be insufficient. Moreover, the carrier concentration might increase or change with an elapse of time, or the Hall mobility, heat resistance or chemical resistance might deteriorate. Furthermore, when the transistor is driven, a threshold voltage might fluctuate, or the driving might is unstable.

Moreover, the range of [X]/([X]+[In]) is more preferably 0.01 to 0.1, further preferably 0.03 to 0.095, especially preferably 0.06 to 0.090.

Preferably, the two or more metals other than In are a positive bivalent metal and a positive tetravalent metal. Thus, in a case where the oxide containing a positive trivalent metal of In as a main component contains the positive bivalent metal and the positive tetravalent metal, a valence is better balanced than in a case where the oxide contains the positive bivalent metal only, and it can therefore be expected that the state of the film is stabilized to improve the reliability thereof.

Examples of the positive bivalent metal include Zn, Be, Mg, Ca, Sr, Ba, Ti, V, Cr, Mn, Fe, Co, Ni, Pd, Pt, Cu, Ag, Cd, Hg, Sm, Eu and Yb. Among them, Zn, Mg, Mn, Co, Ni, Cu and Ca are preferable. Furthermore, among them, Zn, Mg, Cu, Ni, Co, Ca and Sr are more preferable because the use of any of these metals enables the efficient control of the carrier concentration, and Cu and Ni are especially preferable because of an effective carrier control by the addition thereof, and Zn and Mg are especially preferable in view of a transmittance or band gap breadth. Moreover, to decrease etching residues, Zn is most preferable. These positive bivalent metals may be used in the form of a combination thereof in such a range that the effect of the present embodiment is not lost.

Examples of the positive tetravalent metal include Sn, Ge, Si, Ti, C, Pb, Zr, Hf, V, Nb, Ta, Mo, W, Mn, Tc, Re, Fe, Ru, Os, Rh, Ir, Pd and Pt. Above all, Sn, Ge, Si, Ti, C, Zr and Hf are preferable, because each of them enables the efficient control of the carrier concentration. These positive tetravalent metals may be used in the form of a combination thereof in such a range that the effect of the present embodiment is not lost.

Preferably, the positive bivalent metal is at least one element selected from the group consisting of Zn, Mg, Cu, Ni, Co, Ca and Sr, and the positive tetravalent metal is at least one element selected from the group consisting of Sn, Ge, Si, Ti and C. A relation among the number (=[In]) of the atoms of In, the number (=[M2]) of the atoms of the positive bivalent metal and the number (=[M4]) of the atoms of the positive tetravalent metal contained in the crystalline oxide preferably satisfies

[M2]/([M2]+[M4]+[In])=0.0001 to 0.13; and
[M4]/([M2]+[M4])=0.0001 to 0.3.

Also in this case, the electron carrier concentration can be set to be less than $1 \times 10^{18}/cm^3$.

This reason is that when [M4]/([M2]+[M4]) is smaller than 0.0001, an effect of simultaneously containing the positive bivalent metal and the positive tetravalent metal might not be exerted. When the ratio is larger than 0.3, it might become difficult to set an electron carrier density to a value of less than $1 \times 10^{18}/cm^3$.

Moreover, the range of [M4]/([M2]+[M4]) is more preferably 0.001 to 0.2, further preferably 0.005 to 0.1, especially preferably 0.01 to 0.05.

It is to be noted that [M2]/[M2]+[M4]+[In]) is substantially the same as the above [X]/([X]+[In]).

Preferably, the two or more metals other than In may be a positive bivalent metal and a positive trivalent metal. Also in this case, it can be expected that the state of the film is stabilized and its reliability is improved.

Further preferably, the positive bivalent metal is at least one element selected from the group consisting of Zn, Mg, Cu, Ni, Co, Ca and Sr, and the positive trivalent metal is at least one element selected from the group consisting of Ga, Al, B, La, Ce, Pr, Nd, Sm, Eu, Gd, Tb, Dy, Ho, Er, Tm, Yb and Lu. In this case, it can be expected that the state of the film is stabilized to improve the reliability thereof.

Moreover, the positive bivalent metal is especially preferably at least one element selected from the group consisting of Zn, Mg, Cu and Ni, and the positive trivalent metal is especially preferably Dy, Ho, Er, Tm, Yb or Lu.

Preferably, both of the two or more metals other than In are positive bivalent metals. Also in this case, it can be expected that the state of the film is stabilized to improve the reliability thereof.

Further preferably, the two or more metals other than In are one set selected from the group consisting of Zn and Mg, Zn and Cu, Zn and Co, Zn and Ni, Zn and Ca, and Zn and Sr. In this case, it can be expected that the state of the film is further stabilized to improve the reliability thereof.

In addition, at least a part of a positive bivalent metal such as zinc preferably solid-solution-substitutes indium. This reason is that when solid-solution-substituting positive trivalent indium by the positive bivalent metal, it can be expected that the carrier density is effectively decreased.

Moreover, the polycrystalline oxide semiconductor thin film 1002 has an electron carrier concentration of preferably less than $1 \times 10^{18}/cm^3$, more preferably less than $1 \times 10^{17}/cm^3$, further preferably less than $1 \times 10^{16}/cm^3$. This reason is that when the electron carrier concentration is $1 \times 10^{18}/cm^3$ or more, an off current might increase, and an on-off ratio might decrease.

Furthermore, the lower limit of the electron carrier concentration depends on a use application or the like, but usually it is $1 \times 10^{10}/cm^3$ or more, preferably $1 \times 10^{12}/cm^3$ or more. This reason is that when the lower limit is less than $1 \times 10^{10}/cm^3$, the mobility might decrease.

In addition, the electron carrier concentration of the polycrystalline oxide semiconductor thin film 1002 according to the present invention is represented by a value measured at room temperature. The room temperature is, for example, 25° C., and specifically it is a temperature appropriately selected from a range of about 0 to 40° C. It is to be noted that the electron carrier concentration of the crystalline oxide according to the present invention does not have to satisfy the concentration of less than $1 \times 10^{18}/cm^3$ at all temperatures in a range of about 0 to 40° C. If the electron carrier concentration of less than $1 \times 10^{18}/cm^3$, for example, at about 25° C. is accomplished, it can be considered that this fact satisfies the condition of the electron carrier concentration. Preferably, the electron carrier concentration is further decreased to $10^{17}/cm^3$ or less, more preferably $1 \times 10^{16}/cm^3$ or less. In this case, the thin-film transistor 1001 having a normally off state can be obtained in a high yield.

Moreover, the electron carrier concentration is obtained by Hall effect measurement. The electron carrier concentration of less than about $10^{18}/cm^3$ is preferably measured by AC Hall measurement. This reason is that values measured by DC Hall measurement largely fluctuate, and hence the reliability of the measurement might lower.

Preferably, the concentration of Li, Na and K in the polycrystalline oxide semiconductor thin film 1002 is 1000 ppm or less. In this case, when the thin-film transistor 1001 is driven for a long time, the change of the properties of the transistor decreases, and the reliability of the transistor can be improved.

Moreover, the concentration of Li and Na in the crystalline oxide 1021 is preferably 1000 ppm or less. In this case, when the thin-film transistor is driven for a long time, the change of the properties of the transistor decreases, and the reliability of the transistor can be improved. The concentration of Li, Na and K is more preferably 500 ppm or less, further preferably 100 ppm or less, especially preferably 10 ppm or less.

It is to be noted that the present invention is characterized in that the two or more metals other than In are contained, which does not intend to prohibit the addition of another component for improving the properties.

For example, the polycrystalline oxide semiconductor thin film 1002 may include, as an impurity, at least one element selected from the group consisting of Ar, Kr, Xe, Ne and N, and in this case, the electron carrier concentration can easily be controlled.

Preferably, the polycrystalline oxide semiconductor thin film 1002 has PAN resistance.

In this case, the degree of the freedom of production steps increases, and the semiconductor device can efficiently be produced. It is to be noted that the polycrystalline oxide semiconductor thin film 1002 of the present embodiment is patterned in an amorphous state, followed by crystallization. The crystallized polycrystalline oxide semiconductor thin film 1002 has the PAN resistance, and hence the source electrode 1022 and the drain electrode 1023 can easily be patterned.

The polycrystalline oxide semiconductor thin film 1002 has a thickness of usually 0.5 to 500 nm, preferably 1 to 150 nm, more preferably 3 to 80 nm, especially preferably 10 to 60 nm. This reason is that when the thickness is smaller than 0.5 nm, it is difficult to industrially uniformly form the film. On the other hand, when the thickness is larger than 500 mm, a film forming time lengthens, which makes industrial employment difficult. Moreover, when the thickness is in a range of 3 to 80 nm, TFT properties such as the mobility and the on-off ratio are especially excellent.

Moreover, a ratio W/L between a channel width W and a channel length L of the thin-film transistor 1001 is usually 0.1 to 100, preferably 1 to 20, especially preferably 2 to 8. This reason is that when W/L exceeds 100, a leakage current might increase, or the on-off ratio might decrease. Furthermore, when the ratio is smaller than 0.1, field effect mobility might decrease, or pinch-off might become ambiguous.

Furthermore, the channel length L is usually 0.1 to 1000 μm, preferably 1 to 100 μm, further preferably 2 to 10 μm. This reason is that when the length is 0.1 μm or less, industrial production is difficult, a short channel effect might appear, or the leakage current might increase. In addition, when the length is 1000 μm or more, the element becomes excessively large, or a driving voltage disadvantageously increases.

Preferably, an energy band gap between a conduction band and a valence band of the polycrystalline oxide semiconductor thin film 1002 is set to about 2.8 eV or more, and in this case, it is possible to effectively avoid a disadvantage that electrons of the valence band might be excited by irradiation with visible light to allow the leakage current to easily flow.

A material for the gate insulating film 1024 is not particularly restricted, and a usually usable material can arbitrarily be selected in such a range that the effect of the invention in the present embodiment is not lost. It is possible to use an oxide such as $SiO_2$, $SiNx$, $Al_2O_3$, $Ta_2O_6$, $TiO_2$, $MgO$, $ZrO_2$, $CeO_2$, $K_2O$, $Li_2O$, $Na_2O$, $Rb_2O$, $Sc_2O_3$, $Y_2O_3$, $Hf_2O_3$, $CaHfO_3$, $PbTi_3$, $BaTa_2O_6$, $SrTiO_3$ or $AlN$. Among them, $SiO_2$, $SiNx$, $Al_2O_3$, $Y_2O_3$, $Hf_2O_3$ or $CaHfO_3$ is preferably used, $SiO_2$, $SiNx$, $Y_2O_3$, $Hf_2O_3$ or $CaHfO_3$ is more preferably used, and $Y_2O_3$ is especially preferably used. The number of oxygen atoms of such an oxide does not necessarily have to match a stoichiometric ratio (e.g., either $SiO_2$ or $SiOx$ may be used).

Such a gate insulating film may have a structure in which two or more different layers of insulating films are laminated. Moreover, the gate insulating film may be crystalline, polycrystalline or amorphous, but the polycrystalline or amorphous film is preferable because it can industrially easily be produced.

Moreover, a material for the source electrode 1022 or the drain electrode 1023 is not particularly restricted, and a usually usable metal, alloy or oxide conductor material can arbitrarily be selected in such a range that the effect of the invention in the present embodiment is not lost.

Next, a process for producing the polycrystalline oxide semiconductor thin film 1002 used in the thin-film transistor 1001 will be described.

When the polycrystalline oxide semiconductor thin film 1002 is formed, as a sputtering process, there may be utilized a DC sputtering process, a DC magnetron sputtering process, an AC sputtering process, an AC magnetron sputtering process, an RF sputtering process, an RF magnetron sputtering process, a facing target sputtering process, a cylindrical target sputtering process, an ECR sputtering process or the like. Moreover, as a vacuum deposition process, a resistance heating process, an electron beam heating process, a pulse laser deposition (PLD) process or the like may be utilized. Furthermore, as an ion plating process, an ARE process or an HDPE process may be utilized. In addition, as a CVD process, a heat CVD process or a plasma CVD process may be utilized.

Among them, the DC magnetron sputtering process in which discharge is stabilized and which is inexpensive and can easily be enlarged, or the AC magnetron sputtering process is industrially preferable. The DC magnetron sputtering process is especially preferable. Moreover, a co-sputtering process, a reactive sputtering process or a DC/RF superimposition sputtering process may be utilized.

Moreover, when the sputtering process is used, a reached pressure is usually set to $5\times10^{-2}$ Pa or less. This reason is that when the pressure is larger than $5\times10^{-2}$ Pa, the mobility might decrease owing to the impurity in an atmospheric gas.

To more effectively avoid such a disadvantage, the reached pressure is preferably $5\times10^{-3}$ Pa or less, more preferably $5\times10^{-4}$ Pa or less, further preferably $1\times10^4$ Pa or less, especially preferably $5\times10^{-5}$ Pa or less.

Furthermore, an oxygen partial pressure in the atmospheric gas is usually set to $40\times10^{-3}$ Pa or less. When the oxygen partial pressure in the atmospheric gas is larger than $40\times10^{-3}$ Pa, the mobility might decrease, or the carrier concentration might become unstable. Moreover, during wet etching, residues might be generated.

To more effectively avoid such a disadvantage, the oxygen partial pressure in the atmospheric gas is preferably $15\times10^{-3}$ Pa or less, more preferably $7\times10^3$ Pa or less, especially preferably $1\times10^3$ Pa or less.

In addition, a distance between the substrate and the target (the S-T distance) during the sputtering is usually 150 mm or less, preferably 110 mm or less, especially preferably 80 mm or less. This reason is that when the S-T distance is short, the substrate is exposed to plasmas during the sputtering, whereby the activation of the positive bivalent metal can be expected. Moreover, when the distance is larger than 150 mm, a film forming speed becomes slow, which is unsuitable for industrialization.

Usually, the film is physically formed at a substrate temperature of 250° C. or less. When the substrate temperature is higher than 250° C., the effect of a post-treatment is not sufficiently exerted, and it might become difficult to control so as to obtain a low carrier concentration and a high mobility. To more effectively avoid such a disadvantage, the substrate temperature is preferably 200° C. or less, more preferably 150° C. or less, further preferably 100° C. or less, especially preferably 50° C. or less.

Furthermore, in the active layer (a polycrystalline oxide semiconductor thin film 2) of the thin-film transistor 1001, the composition of the metal other than indium is preferably distributed in a film thickness direction. Especially, when the concentration of the metal on a gate insulating film 1024 side is lower than that on the opposite side, the mobility preferably increases.

Moreover, in the present invention, the material, composition ratio, producing conditions, post-treatment conditions and the like of the crystalline oxide (the polycrystalline oxide semiconductor thin film 1002) are controlled to set, for example, an electron carrier concentration to $10^{12}/cm^3$ or more and less than $1\times10^{18}/cm^3$, as in Examples 1 to 13 described later. Furthermore, the electron carrier concentration is set to a range of preferably $10^{13}/cm^3$ or more and $10^{17}/cm^3$ or less, further preferably $10^{15}/cm^3$ or more and $2\times10^{16}/cm^3$ or less. In this case, the thin-film transistor 1001 having an electron mobility of a predetermined level and a normally off state can be obtained in a high yield.

(Measurement Results Concerning Electron Carrier Density and Electron Mobility of Crystalline Oxide)

Next, measurement results concerning the electron carrier density and electron mobility of the polycrystalline oxide semiconductor thin film 1002 will be described with reference to drawings.

Figure 2:
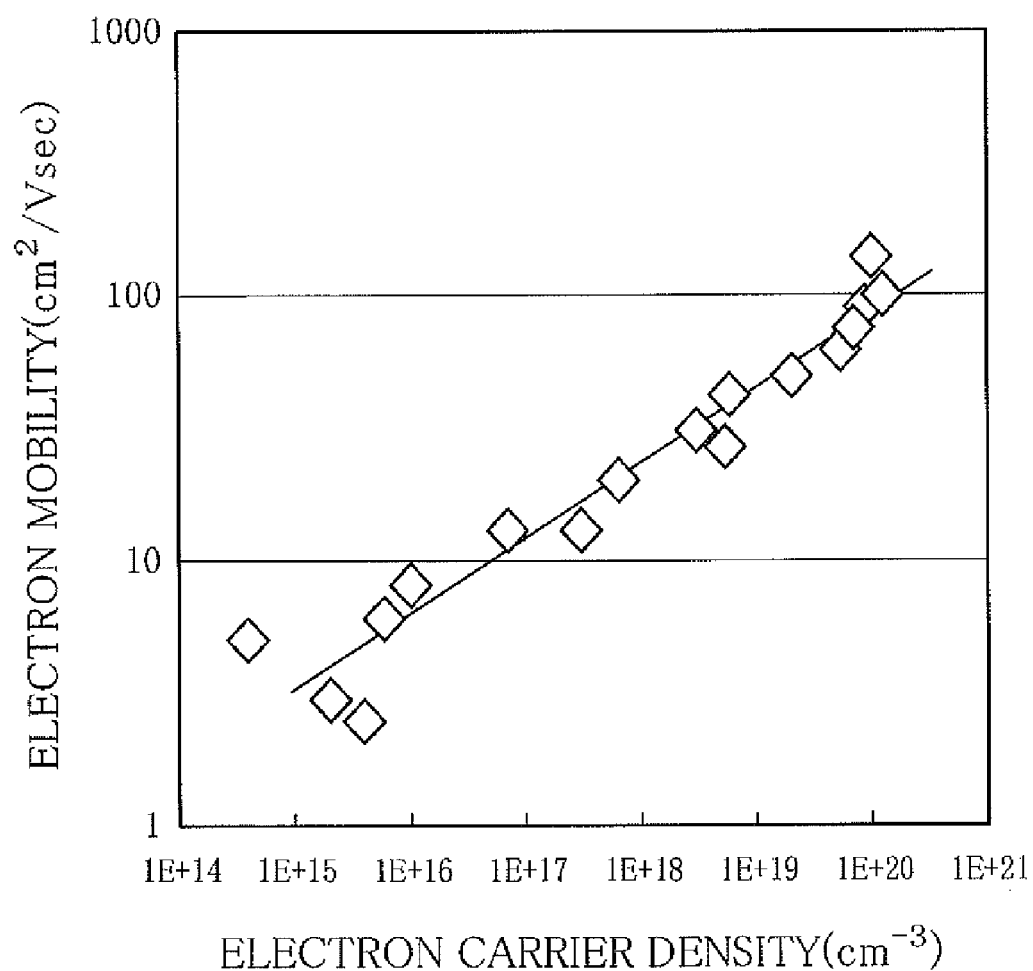
FIG. 2 shows a measurement graph of an electron mobility with respect to the electron carrier concentration of a thin film of a crystalline oxide made of $In_2O_3$—ZnO—$Ga_2O_3$ according to one example of the present invention.

FIG. 2 shows a measurement graph of the electron mobility with respect to the electron carrier concentration of a thin film of a crystalline oxide made of $In_2O_3$—$ZnO$—$Ga_2O_3$ according to one example of the present invention.

In FIG. 2, films were formed at a substrate temperature of about 25° C. by the RF magnetron sputtering process (with an oxygen partial pressure of 0 Pa to $1\times10^{-3}$ Pa) using a sputtering target containing In and two or more metals other than In (Zn and Ga in the present example), to obtain amorphous thin films of $In_2O_3$—ZnO—$Ga_2O_3$. Afterward, the films were subjected to a heat treatment at about 300° C. for about two hours in the presence of oxygen to obtain a plurality of polycrystalline oxide thin films (a plurality of polycrystalline oxide semiconductor thin films 2) of $In_2O_3$—ZnO—$Ga_2O_3$. It is to be noted that the ratio of the number (=[In]) of the atoms of In, the number (=[Zn]) of the atoms of Zn and the number (=[Ga]) of the atoms of Ga was changed to obtain the plurality of crystalline oxide thin films. Subsequently, the electron mobility with respect to the electron carrier concentration of each of the thus obtained crystalline oxide thin films was measured.

Figure 3:
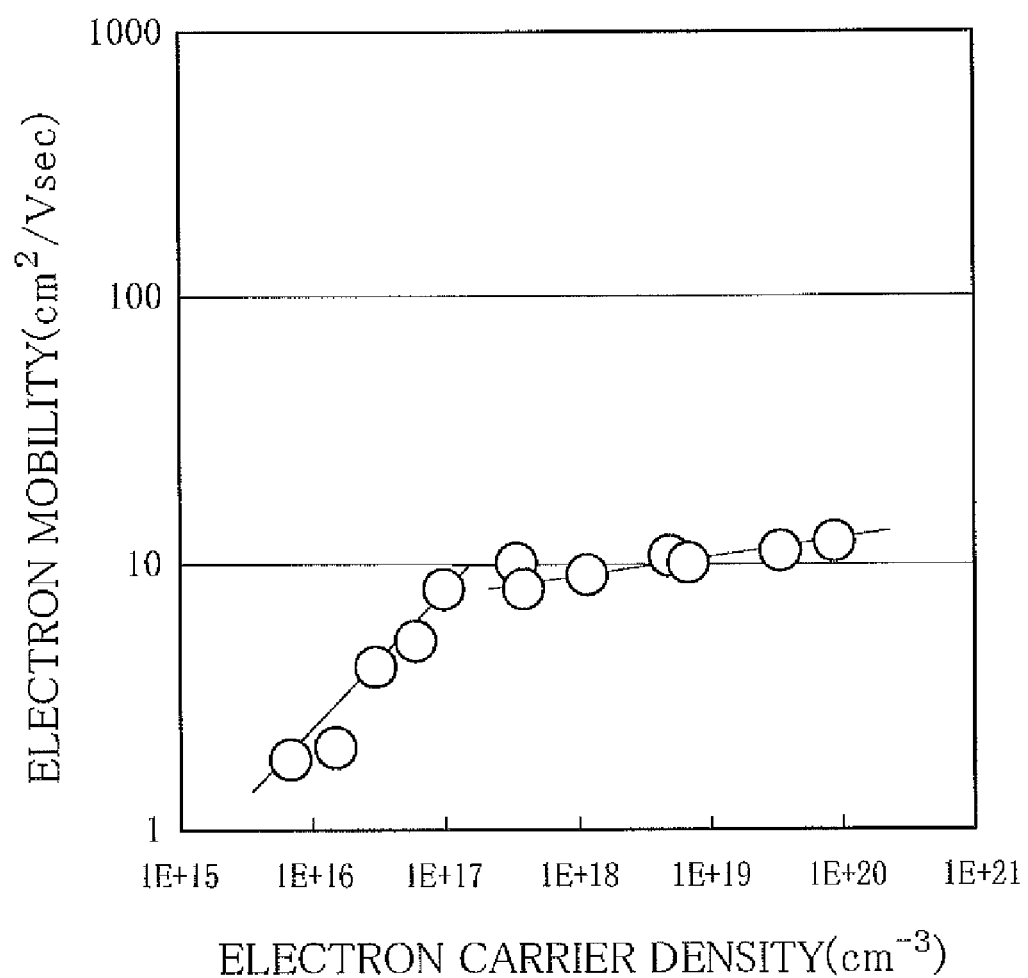
FIG. 3 shows a measurement graph of an electron mobility with respect to the electron carrier concentration of a thin film of an amorphous oxide made of $In_2O_3$—ZnO—$Ga_2O_3$ according to one comparative example of the present invention.

Moreover, FIG. 3 shows a measurement graph of the electron mobility with respect to the electron carrier concentration of a thin film of an amorphous oxide of $In_2O_3$—ZnO—$Ga_2O_3$ according to one comparative example of the present invention.

In FIG. 3, films were formed at a substrate temperature of about 25° C. by the RF magnetron sputtering process (with an oxygen partial pressure of 0 Pa to $5 \times 10^{-2}$ Pa) using a sputtering target containing In and two or more metals other than In (Zn and Ga in the present comparative example), to obtain a plurality of amorphous oxide thin films of $In_2O_3$—ZnO—$Ga_2O_3$. It is to be noted that the ratio of the number (=[In]) of the atoms of In, the number (=[Zn]) of the atoms of Zn and the number (=[Ga]) of the atoms of Ga was changed to obtain the plurality of amorphous oxide thin films. Afterward, the electron mobility with respect to the electron carrier concentration of each of the thus obtained amorphous oxide thin film was measured.

As shown in FIGS. 2 and 3, the producing conditions were appropriately set, whereby the crystalline oxide and the amorphous oxide could be controlled to obtain the electron carrier concentration of less than $1 \times 10^{18}/cm^3$. Moreover, when the concentration was $10^{17}/cm^3$ or more, the electron mobility of the crystalline oxide was indicative of a value higher than that of the amorphous oxide. In consequence, it has been found that when the thin-film transistor is made of the crystalline oxide according to the present invention, a high mobility can be expected in addition to a high reliability, and a transistor property such as the on-off ratio can be improved.

Moreover, in the case of the plurality of crystalline oxide films shown in FIG. 2, the electron mobility increased substantially logarithmically proportionally as the electron carrier concentration increased, in an electron carrier concentration range of $1 \times 10^{15}$ to $1 \times 10^{20}/cm^3$. That is, when the electron carrier concentration (X-coordinate) and the electron mobility (Y-coordinate) are plotted in both the logarithmic graphs, plot points are plotted along a substantially straight line upward to right.

A relation between the number (=[In]) of the atoms of In and the sum (=[X]) of the numbers of the atoms of two or more metals (Zn and Ga) other than In contained in the polycrystalline oxide semiconductor thin film 1002 was set to satisfy [X]/([X]+[In])=0.0001 to 0.13, whereby the electron carrier concentration could be controlled to the value of less than $1 \times 10^{18}/cm^3$.

On the other hand, in the case of the plurality of amorphous oxide films shown in FIG. 3, the electron mobility increased as the electron carrier concentration increased in an electron carrier concentration range of $1 \times 10^{16}$ to $1 \times 10^{17}/cm^3$, in about the same manner as in the thin film made of the crystalline oxide. However, in an electron carrier concentration range of $1 \times 10^{17}$ to $1 \times 10^{20}/cm^3$, the electron mobility increased slightly as the electron carrier concentration increased, but this increment is so small as hardly to observe the increase, as compared with the thin film made of the crystalline oxide.

Moreover, the properties of the thin film made of the amorphous oxide deteriorated by a heat resistance test at 220° C. for 100 hours, whereas the properties of the thin film made of the crystalline oxide hardly changed even by a similar heat resistance test at 220° C. for 100 hours. In consequence, the use temperature range of the semiconductor device can be broadened, and the reliability thereof can be improved.

Furthermore, in the polycrystalline oxide semiconductor thin film 1002, when at least the above atomic ratio [X]/([X]+ [In]) is changed, the electron mobility of the polycrystalline oxide semiconductor thin film 1002 with respect to the electron carrier concentration thereof logarithmically proportionally increases. In consequence, when the producing conditions are controlled, semiconductor properties can easily be set, and the added value of the semiconductor can be improved. That is, with the increase of the electron carrier concentration, the electron mobility increases, and hence the on-off ratio can easily be increased. Moreover, it is possible to improve the properties of the thin-film transistor 1001 in which the off current does not easily increase even when the mobility is increased.

Next, Examples 1 to 13 and Comparative Examples 1 to 6 according to the present invention will be described with reference to the drawing.

Example 1

FIG. 4 is a table showing a film forming process, film forming conditions, a film composition atomic ratio, an oxidation treatment and the properties of a semiconductor thin film in Examples 1 to 13 and Comparative Examples 1 to 6.

Production Example of Crystalline Oxide (1) Production of Sputtering Target

As raw materials, powders of indium oxide, zinc oxide and magnesium oxide were mixed so that an atomic ratio [In]/ ([In]+[Zn]+[Mg]) was 0.93, an atomic ratio [Zn]/([In]+[Zn]+ [Mg]) was 0.06 and an atomic ratio [Mg]/([In]+[Zn]+[Mg]) was 0.01, and the resultant mixture was fed to a wet-type ball mill, mixed and ground for 72 hours to obtain a fine material powder.

The obtained fine material powder was granulated, and then the resultant granules were pressed into a dimension with a diameter of 10 cm and a thickness of 5 mm. The pressed material was placed in a firing furnace, and fired under conditions at 1450° C. for 12 hours to obtain a sintered article (the target).

(2) Formation of Semiconductor Thin Film

The sputtering target obtained in the above (1) was attached to a film forming device using an RF magnetron sputtering process which is one of RF sputtering processes, to form a transparent semiconductor thin film on a glass substrate (Corning 1737).

Here, as sputtering conditions, there were set a substrate temperature of 25° C., a reached pressure of $1 \times 10^{-4}$ Pa, an atmospheric gas of 100% Ar, a sputtering pressure (the total pressure) of $1 \times 10^{-1}$ Pa, an introduced power of 100 W, a film forming time of 20 minutes, and an S-T distance of 100 mm.

Consequently, on the glass substrate, an amorphous oxide having a film thickness of about 100 nm was formed.

(3) Oxidation Treatment of Semiconductor Thin Film

The transparent semiconductor thin film obtained in the above (2) was heated at 300° C. for two hours in the atmosphere (in the presence of oxygen) (the atmospheric heat treatment), to accomplish crystallization.

(4) Evaluation of Physical Properties of Semiconductor Thin Film

The carrier concentration and Hall mobility of the transparent semiconductor thin film obtained in the above (3) were measured by a Hall measurement device. The carrier concentration was $3\times10^{14}$ cm$^{-3}$, and the Hall mobility was 5 cm$^2$/Vs. Moreover, the value of a specific resistance measured by a four terminal method was 1100 Ωcm. Furthermore, the concentrations of Li, Na and K were several ppm or less.

Then, the obtained film composition was analyzed by an ICP method, and in consequence, the atomic ratio [In]/([In]+[Zn]+[Mg]) was 0.93, the atomic ratio [Zn]/([In]+[Zn]+[Mg]) was 0.06, and the atomic ratio [Mg]/([In]+[Zn]+[Mg]) was 0.01.

The Hall measurement device and measurement conditions were as follows.

Hall Measurement Device

Resi Test 8310 manufactured by Toyo Corp.

Measurement Conditions

Room temperature (about 25° C.), about 0.5 [T], about $10^{-4}$ to $10^{-12}$ A, AC magnetic field Hall measurement Furthermore, this semiconductor thin film had a ray transmittance of about 85% with respect to a ray having a wavelength of about 400 nm according to a spectrophotometer, which indicated that it was excellent also in transparency. Moreover, an energy band gap was sufficiently large, about 3.7 eV.

Moreover, according to X-ray crystal structure analysis, it was confirmed that the semiconductor thin film was polycrystalline.

In these examples and comparative examples, PAN resistance and heat resistance were also evaluated, and the results are shown in the table of FIG. 4.

PAN Resistance

The semiconductor thin films in which an etching speed by PAN was about 10 nm/minute or more were denoted by x, and the other films were denoted by o in the table.

Here, for the evaluation of the PAN resistance, a PAN etching solution (about 91.4 wt % of phosphoric acid, about 3.3 wt % of nitric acid and about 5.3 wt % of acetic acid) at about 45° C. was used. It is to be noted that, in the PAN etching solution (the etching solution including phosphoric acid, nitric acid and acetic acid) which is usually used, phosphoric acid is in a range of about 45 to 95 wt %, nitric acid is in a range of about 0.5 to 5 wt %, and acetic acid is in a range of about 3 to 50 wt %.

Heat Resistance

After a heat treatment at 260° C. for one hour, a specific resistance was measured. The semiconductor thin films where the specific resistance was 1/10 or less of that before the heat treatment were denoted by x, and the other films were denoted by o in the table.

The evaluation of the semiconductor thin film of Example 1 was that the PAN resistance and the heat resistance were denoted by o, respectively.

That is, the polycrystallized oxide of Example 1 described above (polycrystalline oxide semiconductor thin film 2) had properties as an excellent transparent semiconductor thin film.

Properties of Thin-Film Transistor

With regard to the semiconductor thin films of Examples 1 to 13 and Comparative Examples 1 to 6, each thin-film transistor of a polycrystalline oxide having W=20 μm, L=20 μm, and a film thickness of 10 nm obtained by regulating a sputtering time was produced on the glass substrate, and the mobility and on-off ratio of each transistor were measured and evaluated.

A thin-film transistor 1001 of the present example had a mobility of 80 cm$^2$/Vs and an on-off ratio of $10^7$ or more, which meant that it had excellent transistor properties.

Moreover, the semiconductor thin films of Examples 2 to 13 and Comparative Examples 1 to 6 were produced and evaluated in the same manner as in Example 1 except that film composition atomic ratios, film forming conditions, oxidation treatment conditions and the like were regulated as shown in the table of FIG. 4.

Example 2

An oxide of Example 2 was produced under about the same producing conditions (a film forming process, film forming conditions, a film composition atomic ratio and an oxidation treatment) as in Example 1 except that Cu was added instead of Mg.

With regard to the properties of the oxide produced under the above producing conditions, as shown in FIG. 4, a crystallinity was polycrystalline, a carrier concentration was about $3\times10^{14}$ cm$^{-3}$, and a Hall mobility was about 5 cm$^2$/Vs. The value of a specific resistance measured by a four terminal method was about 1100 Ωcm. Furthermore, an energy band gap was about 3.2 eV, and PAN resistance and heat resistance were denoted by o in the table, respectively. As transistor properties, though not shown in the drawing, a mobility was 80 cm$^2$/Vs, and an on-off ratio was $10^7$ or more.

That is, the polycrystallized oxide of Example 2 described above had properties as an excellent transparent semiconductor thin film. Moreover, a thin-film transistor 1001 of Example 2 had excellent transistor properties.

Example 3

An oxide of Example 3 was produced under about the same producing conditions (a film forming process, film forming conditions, a film composition atomic ratio and an oxidation treatment) as in Example 1 except that Ni was added instead of Mg.

With regard to the properties of the oxide produced under the above producing conditions, as shown in FIG. 4, a crystallinity was polycrystalline, a carrier concentration was about $3\times10^{14}$ cm$^{-3}$, and a Hall mobility was about 5 cm$^2$Vs. The value of a specific resistance measured by a four terminal method was about 1100 Ωcm. Furthermore, an energy band gap was about 3.2 eV, and PAN resistance and heat resistance were denoted by o in the table, respectively. As transistor properties, though not shown in the drawing, a mobility was 80 cm$^2$/Vs, and an on-off ratio was $10^7$ or more.

That is, the polycrystallized oxide of Example 3 described above had properties as an excellent transparent semiconductor thin film. Moreover, a thin-film transistor 1001 of Example 3 had excellent transistor properties.

Example 4

An oxide of Example 4 was produced under about the same producing conditions (a film forming process, film forming conditions, a film composition atomic ratio and an oxidation treatment) as in Example 1 except that Ga was added instead of Mg.

With regard to the properties of the oxide produced under the above producing conditions, as shown in FIG. 4, a crystallinity was polycrystalline, a carrier concentration was about $3\times10^{14}$ cm$^{-3}$, and a Hall mobility was about 3 cm$^2$/Vs. The value of a specific resistance measured by a four terminal method was about 2300 Ωcm. Furthermore, an energy band gap was about 3.6 eV, and PAN resistance and heat resistance were denoted by o in the table, respectively. As transistor properties, though not shown in the drawing, a mobility was 60 cm$^2$/Vs, and an on-off ratio was 10$^6$ or more.

That is, the polycrystallized oxide of Example 4 described above had properties as an excellent transparent semiconductor thin film. Moreover, a thin-film transistor 1001 of Example 4 had excellent transistor properties.

Example 5

An oxide of Example 5 was produced under about the same producing conditions (a film forming process, film forming conditions, a film composition atomic ratio and an oxidation treatment) as in Example 1 except that Al was added instead of Mg.

With regard to the properties of the oxide produced under the above producing conditions, as shown in FIG. 4, a crystallinity was polycrystalline, a carrier concentration was about 3×10$^{14}$ cm$^{-3}$, and a Hall mobility was about 3 cm$^2$/Vs. The value of a specific resistance measured by a four terminal method was about 2300 Ωcm. Furthermore, an energy band gap was about 3.6 eV, and PAN resistance and heat resistance were denoted by o in the table, respectively. As transistor properties, though not shown in the drawing, a mobility was 65 cm$^2$/Vs, and an on-off ratio was 10$^6$ or more.

That is, the polycrystallized oxide of Example 5 described above had properties as an excellent transparent semiconductor thin film. Moreover, a thin-film transistor 1001 of Example 5 had excellent transistor properties.

Example 6

An oxide of Example 6 was produced under about the same producing conditions (a film forming process, film forming conditions, a film composition atomic ratio and an oxidation treatment) as in Example 1 except that Ce was added instead of Mg.

With regard to the properties of the oxide produced under the above producing conditions, as shown in FIG. 4, a crystallinity was polycrystalline, a carrier concentration was about 3×10$^{14}$ cm$^{-2}$, and a Hall mobility was about 4 cm$^2$/Vs. The value of a specific resistance measured by a four terminal method was about 1300 Ωcm. Furthermore, an energy band gap was about 3.5 eV, and PAN resistance and heat resistance were denoted by o in the table, respectively. As transistor properties, though not shown in the drawing, a mobility was 70 cm$^2$/Vs, and an on-off ratio was 10$^6$ or more.

That is, the polycrystallized oxide of Example 6 described above had properties as an excellent transparent semiconductor thin film. Moreover, a thin-film transistor 1001 of Example 6 had excellent transistor properties.

Example 7

An oxide of Example 7 was produced under about the same producing conditions (a film forming process, film forming conditions, a film composition atomic ratio and an oxidation treatment) as in Example 1 except that Dy was added instead of Mg.

With regard to the properties of the oxide produced under the above producing conditions, as shown in FIG. 4, a crystallinity was polycrystalline, a carrier concentration was about 3×10$^{14}$ cm$^{-3}$, and a Hall mobility was about 4 cm$^2$/Vs. The value of a specific resistance measured by a four terminal method was about 1300 Ωcm. Furthermore, an energy band gap was about 3.5 eV, and PAN resistance and heat resistance were denoted by o in the table, respectively. As transistor properties, though not shown in the drawing, a mobility was 70 cm$^2$/Vs, and an on-off ratio was 10$^6$ or more.

That is, the polycrystallized oxide of Example 7 described above had properties as an excellent transparent semiconductor thin film. Moreover, a thin-film transistor 1001 of Example 7 had excellent transistor properties.

Example 8

An oxide of Example 8 was produced under about the same producing conditions (a film forming process, film forming conditions, a film composition atomic ratio and an oxidation treatment) as in Example 1 except that Er was added instead of Mg.

With regard to the properties of the oxide produced under the above producing conditions, as shown in FIG. 4, a crystallinity was polycrystalline, a carrier concentration was about 3×10$^{14}$ cm$^{-3}$, and a Hall mobility was about 4 cm$^2$/Vs. The value of a specific resistance measured by a four terminal method was about 1300 Ωcm. Furthermore, an energy band gap was about 3.5 eV, and PAN resistance and heat resistance were denoted by o in the table, respectively. As transistor properties, though not shown in the drawing, a mobility was 70 cm$^2$/Vs, and an on-off ratio was 10$^6$ or more.

That is, the polycrystallized oxide of Example 8 described above had properties as an excellent transparent semiconductor thin film. Moreover, a thin-film transistor 1001 of Example 8 had excellent transistor properties.

Example 9

An oxide of Example 9 was produced under about the same producing conditions (a film forming process, film forming conditions, a film composition atomic ratio and an oxidation treatment) as in Example 1 except that Yb was added instead of Mg.

With regard to the properties of the oxide produced under the above producing conditions, as shown in FIG. 4, a crystallinity was polycrystalline, a carrier concentration was about 3×10$^{14}$ cm$^{-3}$, and a Hall mobility was about 4 cm$^2$/Vs. The value of a specific resistance measured by a four terminal method was about 1300 Ωcm. Furthermore, an energy band gap was about 3.5 eV, and PAN resistance and heat resistance were denoted by o in the table, respectively. As transistor properties, though not shown in the drawing, a mobility was 70 cm$^2$/Vs, and an on-off ratio was 10$^6$ or more.

That is, the polycrystallized oxide of Example 9 described above had properties as an excellent transparent semiconductor thin film. Moreover, a thin-film transistor 1001 of Example 9 had excellent transistor properties.

Example 10

An oxide of Example 10 was produced under about the same producing conditions (a film forming process, film forming conditions, a film composition atomic ratio and an oxidation treatment) as in Example 1 except that Ge was added instead of Mg.

With regard to the properties of the oxide produced under the above producing conditions, as shown in FIG. 4, a crystallinity was polycrystalline, a carrier concentration was about 3×10$^{14}$ cm$^{-3}$, and a Hall mobility was about 5 cm$^2$/Vs. The value of a specific resistance measured by a four terminal method was about 1100 Ωcm. Furthermore, an energy band gap was about 3.5 eV, and PAN resistance and heat resistance were denoted by o in the table, respectively. As transistor properties, though not shown in the drawing, a mobility was 75 cm²/Vs, and an on-off ratio was 10⁶ or more.

That is, the polycrystallized oxide of Example 10 described above had properties as an excellent transparent semiconductor thin film. Moreover, a thin-film transistor 1001 of Example 10 had excellent transistor properties.

Example 11

An oxide of Example 11 was produced under about the same producing conditions (a film forming process, film forming conditions, a film composition atomic ratio and an oxidation treatment) as in Example 1 except that Ti was added instead of Mg.

With regard to the properties of the oxide produced under the above producing conditions, as shown in FIG. 4, a crystallinity was polycrystalline, a carrier concentration was about $3\times10^{14}$ cm$^{-3}$, and a Hall mobility was about 5 cm²/Vs. The value of a specific resistance measured by a four terminal method was about 1100 Ωcm. Furthermore, an energy band gap was about 3.5 eV, and PAN resistance and heat resistance were denoted by o in the table, respectively. As transistor properties, though not shown in the drawing, a mobility was 75 cm²/Vs, and an on-off ratio was 10⁶ or more.

That is, the polycrystallized oxide of Example 11 described above had properties as an excellent transparent semiconductor thin film. Moreover, a thin-film transistor 1001 of Example 11 had excellent transistor properties.

Example 12

An oxide of Example 12 was produced under about the same producing conditions (a film forming process, film forming conditions, a film composition atomic ratio and an oxidation treatment) as in Example 1 except that Mg and Sn were added (an atomic ratio [Mg]/([In]+[Zn]+[Mg]+[Sn])= 0.009, and an atomic ratio [Sn]/([In]+[Zn]+[Mg]+[Sn])= 0.001) instead of Mg.

With regard to the properties of the oxide produced under the above producing conditions, as shown in FIG. 4, a crystallinity was polycrystalline, a carrier concentration was about $3\times10^{14}$ cm$^{-3}$, and a Hall mobility was about 6 cm²/Vs. The value of a specific resistance measured by a four terminal method was about 900 Ωcm. Furthermore, an energy band gap was about 3.7 eV, and PAN resistance and heat resistance were denoted by o in the table, respectively. As transistor properties, though not shown in the drawing, a mobility was 90 cm²/Vs, and an on-off ratio was 10⁷ or more.

That is, the polycrystallized oxide of Example 12 described above had properties as an excellent transparent semiconductor thin film. Moreover, a thin-film transistor 1001 of Example 12 had excellent transistor properties.

Example 13

An oxide of Example 13 was produced under about the same producing conditions (a film forming process, film forming conditions, a film composition atomic ratio and an oxidation treatment) as in Example 1 except that Dy and Ge were added (an atomic ratio [Dy]/([In]+[Zn]+[Dy]+[Ge])= 0.009, and an atomic ratio [Ge]/([In]+[Zn]+[Dy]+[Ge])= 0.001) instead of Mg.

With regard to the properties of the oxide produced under the above producing conditions, as shown in FIG. 4, a crystallinity was polycrystalline, a carrier concentration was about $3\times10^{14}$ cm$^{-3}$, and a Hall mobility was about 5 cm²/Vs. The value of a specific resistance measured by a four terminal method was about 1100 Ωcm. Furthermore, an energy band gap was about 3.8 eV, and PAN resistance and heat resistance were denoted by o in the table, respectively. As transistor properties, though not shown in the drawing, a mobility was 80 cm²/Vs, and an on-off ratio was 10⁷ or more.

That is, the polycrystallized oxide of Example 13 described above had properties as an excellent transparent semiconductor thin film. Moreover, a thin-film transistor 1001 of Example 13 had excellent transistor properties.

Comparative Example 1

An oxide of Comparative Example 1 was produced under about the same producing conditions (a film forming process, film forming conditions, a film composition atomic ratio and an oxidation treatment) as in Example 1 except that DC magnetron sputtering was used instead of RF magnetron sputtering, a reached pressure was $10\times10^{-4}$ Pa, a sputtering pressure (the total pressure) was $2\times10^{-1}$ Pa, and any metal other than In was not added.

With regard to the properties of the oxide produced under the above producing conditions, as shown in FIG. 4, a crystallinity was polycrystalline, a carrier concentration was about $1\times10^{18}$ cm$^{-3}$, and a Hall mobility was about 28 cm²/Vs. The value of a specific resistance measured by a four terminal method was about 0.22 Ωcm. Furthermore, an energy band gap was about 4.1 eV, and PAN resistance and heat resistance were denoted by o in the table, respectively. As transistor properties, though not shown in the drawing, a normally-on state was seen, and any transistor properties could not be confirmed.

That is, the polycrystallized oxide of Comparative Example 1 described above did not have properties as a transparent semiconductor thin film.

Comparative Example 2

An oxide of Comparative Example 2 was produced under about the same producing conditions (a film forming process, film forming conditions, a film composition atomic ratio and an oxidation treatment) as in Comparative Example 1 except that Zn was used instead of In and any metal other than Zn was not added.

With regard to the properties of the oxide produced under the above producing conditions, as shown in FIG. 4, a crystallinity was polycrystalline, a carrier concentration was about $6\times10^{17}$ cm$^{-3}$, and a Hall mobility was about 1 cm²/Vs. The value of a specific resistance measured by a four terminal method was about 10 Ωcm. Furthermore, an energy band gap was about 3.3 eV, and PAN resistance was denoted by x and heat resistance was denoted by o in the table. As transistor properties, though not shown in the drawing, a mobility was 3 cm²/Vs, and an on-off ratio was 10⁴ or more.

That is, the polycrystallized oxide of Comparative Example 2 described above had PAN resistance denoted by x and properties as a transparent semiconductor thin film. Moreover, a thin-film transistor of Comparative Example 2 had the transistor properties.

Comparative Example 3

An oxide of Comparative Example 3 was produced under about the same producing conditions (a film forming process, film forming conditions, a film composition atomic ratio and an oxidation treatment) as in Comparative Example 1 except that Zn was added (an atomic ratio [Zn]/([In]+[Zn])=0.05) and any heat treatment was not performed in the atmosphere.

With regard to the properties of the oxide produced under the above producing conditions, as shown in FIG. 4, a crystallinity was amorphous, a carrier concentration was about $3 \times 10^{20}$ cm$^{-3}$, and a Hall mobility was about 35 cm$^2$/Vs. The value of a specific resistance measured by a four terminal method was about 0.0006 Ωcm. Furthermore, an energy band gap was about 4.2 eV, and PAN resistance was x and heat resistance was o in the table. As transistor properties, though not shown in the drawing, a normally on-state was seen, and any transistor properties could not be confirmed.

That is, the oxide of Comparative Example 3 described above did not have properties as a transparent semiconductor thin film.

Comparative Example 4

An oxide of Comparative Example 4 was produced under about the same producing conditions (a film forming process, film forming conditions, a film composition atomic ratio and an oxidation treatment) as in Comparative Example 3 except that Ar=98%+H$_2$=8% were used instead of Ar=100% in the film forming conditions.

With regard to the properties of the oxide produced under the above producing conditions, as shown in FIG. 4, a crystallinity was amorphous, a carrier concentration was about $7 \times 10^{20}$ cm$^{-3}$, and a Hall mobility was about 17 cm$^2$/Vs. The value of a specific resistance measured by a four terminal method was about 0.00053 Ωcm. Furthermore, an energy band gap was about 4.2 eV, and PAN resistance was x and heat resistance was o in the table. As transistor properties, though not shown in the drawing, a normally on-state was seen, and any transistor properties could not be confirmed.

That is, the oxide of Comparative Example 4 described above did not have properties as a transparent semiconductor thin film.

Comparative Example 5

An oxide of Comparative Example 5 was produced under about the same producing conditions (a film forming process, film forming conditions, a film composition atomic ratio and an oxidation treatment) as in Comparative Example 4 except that RF magnetron sputtering was used instead of DC magnetron sputtering, Ar=96%+O$_2$=4% were used in the film forming conditions, an oxygen partial pressure was $8 \times 10^{-3}$ Pa, and the atomic ratio of In and Zn was changed (an atomic ratio [In]/([In]+[Zn])=0.55, and an atomic ratio [Zn]/([In]+[Zn])=0.45).

With regard to the properties of the oxide produced under the above producing conditions, as shown in FIG. 4, a crystallinity was amorphous, a carrier concentration was about $1.1 \times 10^{16}$ cm$^{-3}$, and a Hall mobility was about 3 cm$^2$/Vs. The value of a specific resistance measured by a four terminal method was about 190 Ωcm. Furthermore, an energy band gap was about 3.7 eV, and PAN resistance was x and heat resistance was x in the table. As transistor properties, though not shown in the drawing, a mobility was 25 cm$^2$/Vs, and an on-off ratio was $10^5$ or more.

That is, in the oxide of Comparative Example 5 described above, the PAN resistance and heat resistance were x, and the oxide had properties as a transparent semiconductor thin film. Moreover, a thin-film transistor of Comparative Example 5 had the transistor properties.

Comparative Example 6

An oxide of Comparative Example 6 was produced under about the same producing conditions (a film forming process, film forming conditions, a film composition atomic ratio and an oxidation treatment) as in Comparative Example 5 except that RF magnetron sputtering was used instead of DC magnetron sputtering, Ar=95%+O$_2$=5% were used in the film forming conditions, and an oxygen partial pressure was $10 \times 10^{-3}$ Pa.

With regard to the properties of the oxide produced under the above producing conditions, as shown in FIG. 4, a crystallinity was amorphous, a carrier concentration was about $9 \times 10^{15}$ cm$^{-3}$, and a Hall mobility was about 2 cm$^2$/Vs. The value of a specific resistance measured by a four terminal method was about 350 Ωcm. Furthermore, an energy band gap was about 3.8 eV, and PAN resistance was x and heat resistance was x in the table. As transistor properties, though not shown in the drawing, a mobility was 18 cm$^2$/Vs, and an on-off ratio was $10^4$ or more.

That is, in the oxide of Comparative Example 6 described above, the PAN resistance and heat resistance were x, and the oxide had properties as a transparent semiconductor thin film. Moreover, a thin-film transistor of Comparative Example 6 had the transistor properties.

As described above, in the thin-film transistor 1001 of the present embodiment, the polycrystalline oxide semiconductor thin film 1002 containing In and two or more metals other than In is used as the active layer of the thin-film transistor 1001, and the electron carrier concentration of the polycrystalline oxide semiconductor thin film 1002 is set to be less than about $1 \times 10^{18}$/cm$^3$. In consequence, the transistor is excellent in stability, uniformity, reproducibility, heat resistance, durability and the like, and can exert the excellent transistor properties. Furthermore, it is possible to provide the thin-film transistor 1001 which is excellent in large area uniformity and reproducibility.

One Embodiment of Polycrystalline Semiconductor Thin Film and Process for Producing the Film The polycrystalline semiconductor thin film according to one embodiment of the present invention is a polycrystalline semiconductor thin film containing indium, a positive bivalent element and oxygen. The film has a crystallinity with a locking curve half value width of 1° or less in an X-ray diffraction method, and takes a constitution in which crystals are aligned in a predetermined direction.

The polycrystalline semiconductor thin film of the present embodiment has a locking curve half value width of 1° or less in the X-ray diffraction method, and has a high crystallinity. This reason is that when the locking curve half value width is larger than 1°, the crystallinity is low, and, for example, the field effect mobility of a transistor in which the polycrystalline semiconductor thin film is used for the active layer might decrease. Moreover, the half value width is preferably 0.5° or less, further preferably 0.3° or less. It is to be noted that this half value width does not have any lower limit, but the half value width is usually 0.01° or more.

Figure 5:
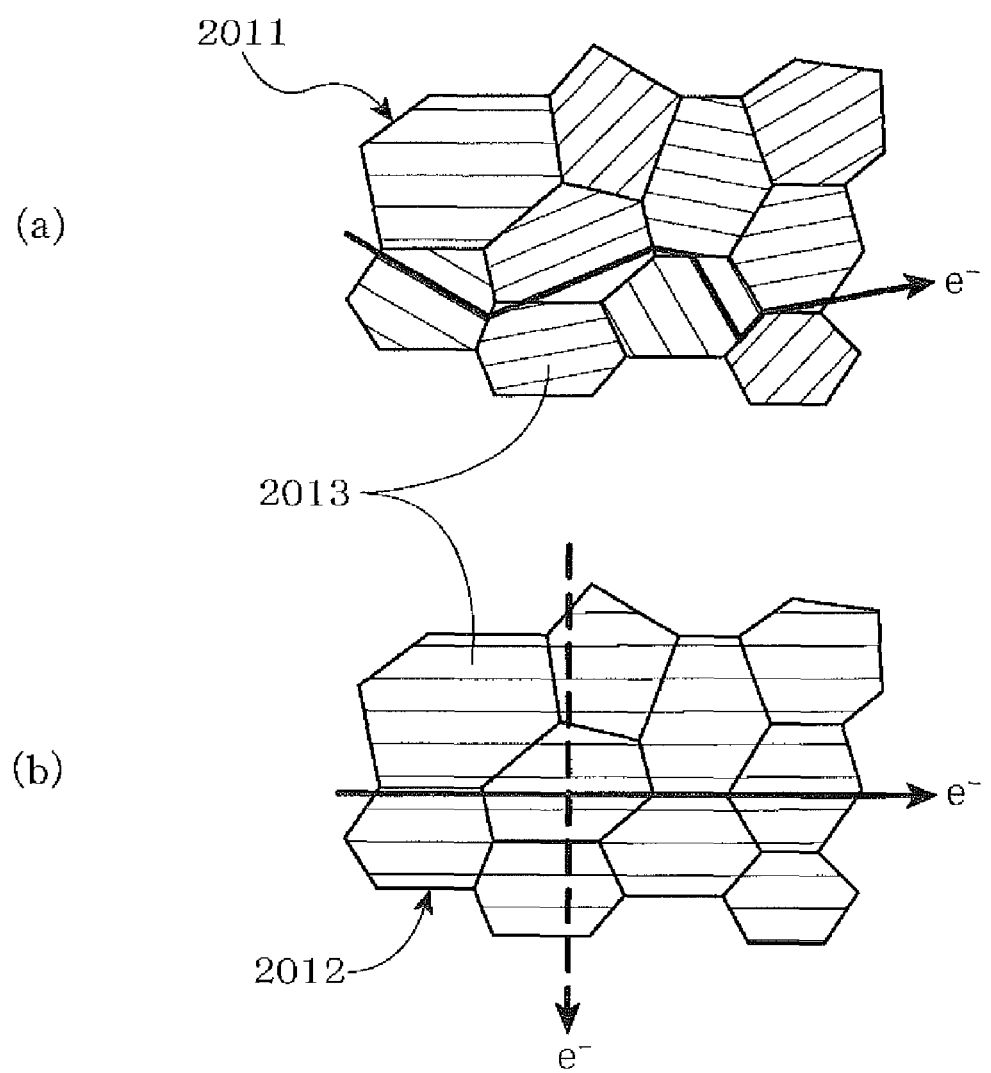
FIG. 5 is a schematic diagram for explaining the alignment control of a polycrystalline semiconductor thin film according to one embodiment, (a) shows an enlarged plan view of a non-aligned film, and (b) shows an enlarged plan view of an aligned film.

FIG. 5 is a schematic diagram for explaining the alignment control of the polycrystalline semiconductor thin film according to the embodiment, (a) shows an enlarged plan view of a non-aligned film, and (b) shows an enlarged plan view of an aligned film.

As shown in FIG. 5(a), when the polycrystalline semiconductor thin film is a non-aligned film 2011, conduction paths 2013 of crystals have different directions, and hence electrons e$^-$ move while curving in a complicated manner. Therefore, the electron mobility is suppressed to a small value. On the other hand, as shown in FIG. 5(b), when the polycrystalline semiconductor thin film is an aligned film 2012, conduction paths 2013 of the crystals face the same direction (the horizontal direction), and hence electrons e$^-$ which are to move in the horizontal direction can substantially linearly move. Therefore, the electron mobility noticeably improves as compared with the non-aligned film 2011. However, electrons e⁻ which are to move in a vertical direction have to move so as to substantially pass through the conduction paths 2013. In consequence, the electron mobility is suppressed to a small value as compared with the non-aligned film 2011.

That is, when the alignment control of the polycrystalline semiconductor thin film is performed, a current can efficiently be allowed to flow, or the current can efficiently be blocked. Therefore, for example, properties such as the on-off ratio of the transistor can be improved. It is to be noted that the alignment control can be performed by controlling, for example, the position of the substrate with respect to the target during the film formation, the applied voltage during the sputtering, the oxygen partial pressure, the total pressure or the like. However, an alignment control method is not limited to this way.

Moreover, the polycrystalline semiconductor thin film is a thin film made of a polycrystalline oxide containing indium, a positive bivalent element and oxygen. In this polycrystalline oxide, for example, the electron carrier concentration can be set to be $10^{12}/cm^3$ or more and less than $10^{18}/cm^3$, more preferably $10^{13}/cm^3$ or more and $10^{17}/cm^3$ or less, further preferably $10^{15}/cm^3$ or more and $10^{16}/cm^3$ or less by controlling a material, a composition ratio, producing conditions, post-treatment conditions and the like, as described later. In consequence, it is possible to obtain, in a good yield, a normally off field effect transistor having an electron mobility with a predetermined level.

Furthermore, the electron carrier concentration of the polycrystalline semiconductor thin film according to the present invention is a value measured at room temperature. The room temperature is, for example, 25° C., and is specifically a temperature appropriately selected from a range of about 0 to 40° C. It is to be noted that the electron carrier concentration of the polycrystalline semiconductor thin film according to the present invention does not have to satisfy the concentration of less than $10^{18}/cm^3$ in the whole range of 0 to 40° C. For example, the carrier density in the vicinity of the room temperature is preferably less than $10^{18}/cm^{-3}$, more preferably less than $2 \times 10^{17}$ cm$^{-3}$, further preferably less than $10^{17}$ cm$^{-3}$, especially preferably less than $5 \times 10^{16}$ cm$^{-3}$. When the density is set to, for example, $10^{16}/cm^3$ or less, a normally off field effect transistor can be obtained in a good yield.

When the carrier density is $10^{18}$ cm$^{-3}$ or more, the thin film might not be driven as the field effect transistor. Moreover, even when driven as the field effect transistor, the thin film might be normally on or might have a large threshold voltage, a small on-off ratio or a large leakage current.

It is to be noted that the lower limit value of the electron carrier concentration is not particularly restricted, as long as the thin film can be applied as, for example, a channel layer of the field effect transistor. The lower limit value is, for example, $10^{12}/cm^3$.

Moreover, the electron carrier concentration is obtained by a Hall effect measurement. The electron carrier concentration of less than about $10^{18}/cm^3$ is preferably measured by AC Hall measurement. This reason is that values measured by DC Hall measurement noticeably fluctuate, which might deteriorate the reliability of the measurement.

Furthermore, in the polycrystalline semiconductor thin film, an X-ray diffraction pattern in the X-ray diffraction method indicates the pattern of Vicks byte structure, and a diffraction intensity ratio (I(222)/I (400)) between a (222) peak intensity (I(222)) and a (400) peak intensity (I(400)) is preferably smaller than 1.0, further preferably smaller than 0.6, more preferably smaller than 0.3, especially preferably smaller than 0.1.

In addition, the diffraction intensity ratio (I(222)/I(400)) is preferably larger than 10, further preferably larger than 15, more preferably larger than 20, especially preferably larger than 30.

In this case, when the polycrystalline semiconductor thin film is applied to the transistor, it is possible to avoid a disadvantage such as the decrease of the field effect mobility or the on-off ratio, the increase of a gate leakage current or an off current might, or the deterioration of the reliability.

A relation between the number (=[In]) of the atoms of indium and the number (=[X]) of the atoms of the positive bivalent element in the polycrystalline semiconductor thin film preferably satisfies [X]/([X]+[In])=0.0001 to 0.13, more preferably 0.001 to 0.1, further preferably 0.01 to 0.097, especially preferably 0.06 to 0.095. This reason is that when the ratio is smaller than 0.0001, indium might exert less effect as a dopant, the carrier density might increase, or residues might be generated during the wet etching. Moreover, when the ratio is larger than 0.13, a crystallization temperature might rise, and hence at 500° C. or less, the crystallization is impossible. Even when the crystallization is possible, the crystallinity might lower. In addition, the locking curve half value width of the X-ray diffraction method might increase, or the mobility of the thin film after the crystallization might decrease.

Preferably, the positive bivalent element is one or more elements selected from the group consisting of zinc, magnesium, copper, cobalt, nickel, calcium and strontium. In this case, the electron carrier concentration can efficiently be controlled.

Moreover, in view of the effect of carrier control by addition, Cu and Ni are especially preferable, and in view of transmittance or band gap breadth, Zn and Mg are especially preferable. Moreover, to decrease the etching residues, Zn is most preferable. These positive bivalent elements may be used in the form of a combination of them in such a range that the effect of the present embodiment is not lost.

It is to be noted that in addition to the above elements, examples of the positive bivalent element include Be, Ba, Ti, V, Cr, Mn, Fe, Pd, Pt, Ag, Cd, Hg, Sm, Eu and Yb.

Preferably, the polycrystalline semiconductor thin film contains a positive tetravalent element in an amount smaller than that of the positive bivalent element. Thus, in a case where the positive tetravalent element is contained, valence is advantageously balanced as compared with a case where the positive bivalent element only is contained. Therefore, the positive bivalent element can be stabilized in the oxide of indium which is the positive trivalent element, whereby the reliability and uniformity can be improved.

It is to be noted that examples of the positive tetravalent element include Sn, Ge, Si, C, Pb, Zr, Ce, Nd, Tb, Ti, V, Hf, Mo and Ru. Above all, Sn, Ge, Si, C, Zr or Ti is preferable, because they can easily stabilize the positive bivalent element. These positive tetravalent elements may be used in the form of a combination of them in such a range that the effect of the present embodiment is not lost.

Moreover, to develop such an effect, a ratio [M4]/[M2] between the number (=[M4]) of the atoms of the positive tetravalent element and the number (=[M2]) of the atoms of the positive bivalent element is preferably 0.0001 or more and 0.5 or less, more preferably 0.001 or more and 0.1 or less, further preferably 0.001 or more and 0.05 or less.

Moreover, the polycrystalline semiconductor thin film of the present embodiment is preferably insoluble in a phosphoric acid-based etching solution (PAN) and soluble in an oxalic acid-based etching solution.

Thus, when the polycrystalline semiconductor thin film is insoluble in the phosphoric acid-based etching solution (PAN) and soluble in the oxalic acid-based etching solution, a semiconductor device such as the thin-film transistor can be produced by using simple wet etching. That is, it is not necessary to use dry etching in which an equipment cost is high, an etching speed is low, and problems of deposit and the like are generated. In addition, it is not necessary to use lift-off in which steps are complicated and enlargement is difficult.

Furthermore, the PAN etching solution (the etching solution containing phosphoric acid, nitric acid and acetic acid) preferably contains 45 to 95 wt % of phosphoric acid, 0.5 to 5 wt % of nitric acid and 3 to 50 wt % of acetic acid. Moreover, a solution temperature is preferably 20 to 50° C.

In the case of the phosphoric acid-based etching solution (PAN), an etching speed at 35° C. is preferably less than 10 nm/minute, more preferably less than 5 nm/minute, further preferably 2 nm/minute.

The oxalic acid-based etching solution preferably contains 0.5 to 10 wt % of oxalic acid. Moreover, a solution temperature is preferably 20 to 50° C.

In the case of the oxalic acid-based etching solution, an etching speed at 35° C. is preferably 20 nm/minute or more, more preferably 50 nm/minute or more, further preferably 80 nm/minute or more, especially preferably 120 nm/minute or more. The upper limit of the etching speed of the oxalic acid-based etching solution is preferably 800 nm/minute or less, more preferably 500 nm/minute or less, further preferably 400 nm/minute. When the speed is larger than 800 nm/minute, it becomes difficult to control the accuracy of the etching, fluctuations might increase, and a chemical resistance might lower.

Next, a process for producing the polycrystalline semiconductor thin film will be described.

First, examples of the film forming process of the polycrystalline semiconductor thin film include a sputtering process, a vacuum deposition process, an ion plating process, and a pulse laser deposition process, but the sputtering process is industrially preferable because the high mass productivity thereof is possible.

Examples of the sputtering process include a DC sputtering process, an RF sputtering process, an AC sputtering process, an ECR sputtering process, and a facing target sputtering process. Among them, the DC sputtering process and the AC sputtering process are preferable, because the industrially high mass productivity is possible, and the carrier concentration can easily be decreased as compared with the RF sputtering process. Moreover, for purposes of suppressing the deterioration of an interface due to the film formation to suppress the leakage current and improving the on-off ratio and other properties of a transparent semiconductor thin film 40, the ECR sputtering process and the facing target sputtering process are preferable in which a film quality is easily controlled.

Moreover, an oxygen partial pressure during the sputtering is preferably 0 to 0.01 Pa, further preferably 0 to 0.005 Pa, more preferably 0 to 0.001 Pa. This reason is that when the oxygen partial pressure is larger than 0.01 Pa, the in-plane uniformity of the electron carrier density might deteriorate, and the in-plane uniformity of transistor properties such as the mobility and the on-off ratio might deteriorate.

Furthermore, the reached pressure during the film formation is preferably $8\times10^{-4}$ Pa or less, further preferably $4\times10^{-4}$ Pa or less, further preferably $1\times10^{-4}$ Pa or less, especially preferably $8\times10^{-5}$ Pa or less. This reason is that when the reached pressure during the film formation is larger than $8\times10^{-4}$ Pa, contamination with impure gas components might increase, a crystallization temperature might rise, the film quality might deteriorate, the crystallinity might lower, or the alignment might fall into disorder. Moreover, owing to the contamination with the impure gas components, the mobility might decrease.

The amorphous referred to herein means a substance in which a halo pattern is observed by X-ray diffraction and any specific diffraction line is not shown. Moreover, the amorphous includes another substance in which fine crystals can be confirmed by the observation with TEM or the like. However, the fine crystals might become residues during the etching, and hence the amount of the fine crystals is preferably less or absent.

In addition, during the film formation, the amorphous film is advantageously formed at a substrate temperature of 150° C. or less, and in such a case, the amorphous film can securely be formed. Subsequently, the amorphous film is successfully crystallized at a temperature above 150° C. and not more than 500° C. to form the polycrystalline semiconductor thin film. In such a case, during the heating crystallization, an oxygen deficit amount and crystallinity can effectively be controlled.

As described above, according to the polycrystalline semiconductor thin film and the process for producing the same in the present embodiment, the crystal configuration of the polycrystalline thin film containing the positive bivalent element and oxygen is made appropriate, whereby it is possible to provide the polycrystalline semiconductor thin film which is excellent in transistor properties, reliability, productivity, large area uniformity and reproducibility and which enables high fineness.

Furthermore, according to the present embodiment, the amounts of indium, tin and zinc can be set to appropriate amounts to prepare the polycrystalline semiconductor thin film which is insoluble in the PAN-based etching solution and which is soluble in the oxalic acid-based etching solution. When this polycrystalline semiconductor thin film is used, the wet etching can be used for both semiconductors and electrodes to produce the thin-film transistor, and productivity and economical efficiency can noticeably be improved.

One Embodiment of Field Effect Transistor and Process for Producing the Same

Figure 6:
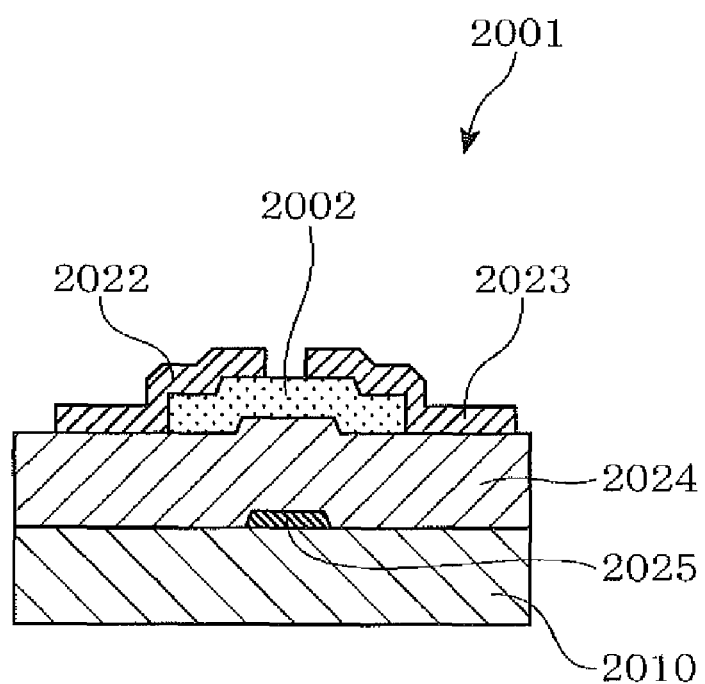
FIG. 6 shows a schematic sectional view of a main part of a field effect transistor according to one embodiment of the present invention.

FIG. 6 shows a schematic sectional view of a main part of a field effect transistor according to one embodiment of the present invention.

In FIG. 6, the field effect transistor is a bottom gate type thin-film transistor 2001. This thin-film transistor 2001 includes a gate electrode 2025 formed on a glass substrate 2010, a gate insulating film 2024 laminated on the gate electrode 2025 and the glass substrate 2010, a polycrystalline oxide semiconductor thin film 2002 as an active layer formed on the gate insulating film 2024 above the gate electrode 2025, and a source electrode 2022 and a drain electrode 2023 formed away from each other on the polycrystalline oxide semiconductor thin film 2002.

It is to be noted that the thin-film transistor 2001 is not limited to the above bottom gate type, and may be a thin-film transistor having, for example, a top gate type or one of various constitutions. A base material on which the thin-film transistor 2001 is formed is not limited to the glass substrate 2010, and may be, for example, a resin film having flexibility.

Moreover, as the polycrystalline oxide semiconductor thin film 2002, the polycrystalline semiconductor thin film of the above embodiment is used. In this case, it is possible to provide the thin-film transistor 2001 having a large field effect mobility, a large on-off ratio, a small gate leakage current, a small off current, and excellent transistor properties. Moreover, the thin-film transistor 2001 is excellent in reliability, productivity, large area uniformity and reproducibility, and enables high fineness.

Furthermore, in the thin-film transistor 2001, the gate electrode 2025 may be in self-alignment with the source electrode 2022 and the drain electrode 2023, and the self-aligning can decrease a leakage current.

Moreover, a ratio W/L between a channel width W and a channel length L of the thin-film transistor 2001 is usually 0.1 to 100, preferably 1 to 20, especially preferably 2 to 8. When W/L exceeds 100, the leakage current might increase, or the on-off ratio might decrease. When the ratio is smaller than 0.1, the field effect mobility might decrease, or pinch-off might become ambiguous.

Furthermore, the channel length L is usually 0.1 to 1000 μm, preferably 1 to 100 μm, further preferably 2 to 10 μm. When the length is 0.1 μm or less, it is difficult to industrially produce the transistor, or the leakage current might increase. When the length is 1000 μm or more, the element disadvantageously becomes excessively large.

In addition, the film thickness of the polycrystalline oxide semiconductor thin film 2002 is usually 0.5 to 500 nm, preferably 1 to 150 nm, more preferably 3 to 80 nm, especially preferably 10 to 60 nm. When the thickness is smaller than 0.5 nm, it is difficult to industrially uniformly form the film. On the other hand, when the thickness is larger than 500 nm, a film forming time lengthens, which cannot industrially be employed. Moreover, when the thickness is in a range of 3 to 80 nm, TFT properties such as the mobility and the on-off ratio are especially excellent.

Furthermore, the field effect mobility of the thin-film transistor 2001 is usually set to be 1 $cm^2/Vs$ or more. When the field effect mobility is smaller than 1 $cm^2/Vs$, a switching speed might lower. To particularly effectively avoid such a disadvantage, the field effect mobility is preferably 5 $cm^2/Vs$ or more, more preferably 18 $cm^2/Vs$ or more, further preferably 30 $cm^2/Vs$ or more, especially preferably 50 $cm^2/Vs$ or more.

Moreover, the on-off ratio of the thin-film transistor 2001 is usually set to be $10^3$ or more, preferably $10^4$ or more, more preferably $10^5$ or more, further preferably $10^6$ or more, especially preferably $10^7$ or more.

Furthermore, the threshold voltage (Vth) is preferably plus and normally off. When the threshold voltage (Vth) is minus and normally on, a power consumption might increase.

In addition, a gate voltage/drain voltage during the driving of the transistor is usually 100 V or less, preferably 50 V or less, more preferably 20 V or less. When the voltage is larger than 100 V, the power consumption increases, whereby practicability might deteriorate.

Moreover, in the active layer (the polycrystalline oxide semiconductor thin film 2002) of the thin-film transistor 2001, the composition of the metal other than indium is preferably distributed in a film thickness direction. Particularly, when the concentration of the metal on a gate insulating film 2024 side is lower than on the opposite side, the mobility preferably increases. That is, when the amount of oxygen is large on the gate insulating film side, the carrier density in the vicinity of an interface between the active layer and the gate insulating film can be decreased to improve the on-off ratio and the like of the transistor. When the amount of oxygen is small on the gate insulating film side, the on-off ratio might decrease.

Furthermore, a material to form the gate insulating film 2024 is not particularly restricted, and a usually usable material can arbitrarily be selected in such a range that the effect of the invention in the present embodiment is not lost.

As the material, for example, an oxide such as $SiO_2$, SiNx, $Al_2O_3$, $Ta_2O_5$, $TiO_2$, MgO, $ZrO_2$, $CeO_2$, $K_2O$, $Li_2O$, $Na_2O$, $Rb_2O$, $Sc_2O_3$, $Y_2O_3$, $Hf_2O_3$, $CaHfO_3$, $PbTi_3$, $BaTa_2O_6$, $SrTiO_3$ or AlN can be used. Among them, $SiO_2$, SiNx, $Al_2O_3$, $Y_2O_3$, $Hf_2O_3$ or $CaHfO_3$ is preferably used, $SiO_2$, SiNx, $Y_2O_3$, $Hf_2O_3$ or $CaHfO_3$ is more preferably used, and $Y_2O_3$ is especially preferably used. The number of the oxygen atoms of such an oxide does not necessarily have to match a stoichiometric ratio (e.g., either of $SiO_2$ and SiOx is allowable).

Such a gate insulating film may have a structure in which two or more different layers of insulating films are laminated. Moreover, the gate insulating film may be crystalline, polycrystalline or amorphous, but the polycrystalline or amorphous film which can industrially easily be handled in the manufacture is preferable.

Moreover, a material to form each electrode of the gate electrode 2025, the source electrode 2022 and the drain electrode 2023 is not particularly restricted, and a usually usable material can arbitrarily be selected in such a range that the effect of the invention in the present embodiment is not lost.

For example, a transparent electrode made of indium tin oxide (ITO), indium zinc oxide, ZnO, $SnO_2$ or the like, a metal electrode made of Al, Ag, Cr, Ni, Mo, Au, Ti, Ta or the like, or a metal electrode made of an alloy including these metals can be used. Moreover, two or more layers of these electrodes are preferably laminated to decrease a contact resistance or increase an interface strength.

Moreover, when a transparent conductive film is used as an electrode layer, the transparent conductive film is preferably in the form of an amorphous oxide during etching. For example, indium zinc oxide or indium tin oxide (ITO) made amorphous by water or hydrogen can be used. In the case of the crystallized amorphous transparent conductive film made of indium tin oxide (ITO) or the like, it might become difficult to etch the film with an oxalic acid-based etching solution. The amorphous transparent conductive film may be crystallized by a heat treatment or the like after the etching. When the electrode layer is made of the transparent conductive film, a transparent transistor can easily be produced by a wet etching process.

Preferably, the concentration of Li, Na and K in the polycrystalline oxide semiconductor thin film 2002 is 1000 ppm or less. In this case, when the thin-film transistor 2001 is driven for a long time, the change of the properties of the transistor decreases, and hence the reliability thereof can be improved.

It is to be noted that the present invention is characterized by adding one or more positive bivalent elements to In, but this does not intend to prohibit the addition of another component for improving the properties.

For example, the polycrystalline oxide semiconductor thin film 2002 may include, as an impurity, at least one element selected from the group consisting of Ar, Kr, Xe, Ne and N, and in this case, an electron carrier concentration can easily be controlled.

Preferably, the polycrystalline oxide semiconductor thin film 2002 has PAN resistance.

In this case, the degree of the freedom of production steps increases, and a semiconductor device can efficiently be produced. It is to be noted that the polycrystalline oxide semiconductor thin film 2002 of the present embodiment is patterned in an amorphous state, and then crystallized. The crystallized polycrystalline oxide semiconductor thin film 2002 has the PAN resistance, and hence the source electrode 2022 or the drain electrode 2023 can easily be patterned.

Preferably, an energy band gap between a conduction band and a valence band of the polycrystalline oxide semiconductor thin film 2002 is set to about 2.8 eV or more. In this case, it is possible to effectively avoid a disadvantage that electrons of the valence band might be excited by the irradiation with visible light to allow a leakage current to easily flow.

Moreover, when producing conditions are controlled, semiconductor properties can easily be set, and the added value of the semiconductor can be improved. That is, with the increase of the electron carrier concentration, an electron mobility increases, and hence the properties of the thin-film transistor 2001 can be improved. For example, the on-off ratio can easily be increased, and the increase of the off current can be inhibited even when the mobility is increased.

It is to be noted that as a process for producing the thin-film transistor 2001, the above process for producing the polycrystalline semiconductor thin film can be applied, whereby a substantially similar effect can be obtained.

As described above, the thin-film transistor 2001 of the present embodiment is excellent in stability, uniformity, reproducibility, heat resistance, durability and the like, and can exert excellent transistor properties. Furthermore, it is possible to provide the thin-film transistor 2001 which is excellent in large area uniformity or reproducibility and which enables high fineness.

Next, Examples 14 to 16 and Comparative Examples 7 to 9 according to the present invention will be described with reference to the drawings.

Example 14

FIG. 7 is a table showing a film forming process, a substrate position, film forming conditions, a film composition atomic ratio, a heat treatment and the properties of each of semiconductor thin films in Examples 14 to 16 and Comparative Examples 7 to 9.

(1) Production and Evaluation of Sputtering Target

1. Production of Target

As raw materials, powders of indium oxide and zinc oxide were mixed so that an atomic ratio [In]/([In]+[Zn]) was 0.93 and an atomic ratio [Zn]/([In]+[Zn]) was 0.07, and the resultant mixture was fed to a wet-type ball mill, mixed and ground for 72 hours to obtain a fine material powder.

The obtained fine material powder was granulated, and then the resultant granules were pressed into a dimension with a diameter of 10 cm and a thickness of 5 mm. The pressed material was placed in a firing furnace, and fired under conditions at 1450° C. for 48 hours to obtain a sintered article (the target). At this time, a temperature rise speed was 3° C./minute.

2. Evaluation of Target

With regard to the obtained target, a density and a bulk resistance value were measured. As a result, a theoretical relative density was 98%, and the bulk resistance value measured by a four terminal method was 5 mΩ.

(2) Formation of Transparent Semiconductor Thin Film

The sputtering target obtained in the above (1) was attached to a film forming device (manufactured by Shinko Seiki Co., Ltd) using an RF magnetron sputtering process which is one of sputtering processes, to form a transparent conductive film on a glass substrate (Corning 1737).

Here, as sputtering conditions, there were set a substrate temperature of 25° C., a reached pressure of $0.1 \times 10^{-4}$ Pa, an atmospheric gas of 100% Ar, a sputtering pressure (the total pressure) of 0.1 Pa, an introduced power of 100 W, a film forming time of 25 minutes, and an S-T distance of 100 mm.

Figure 8:
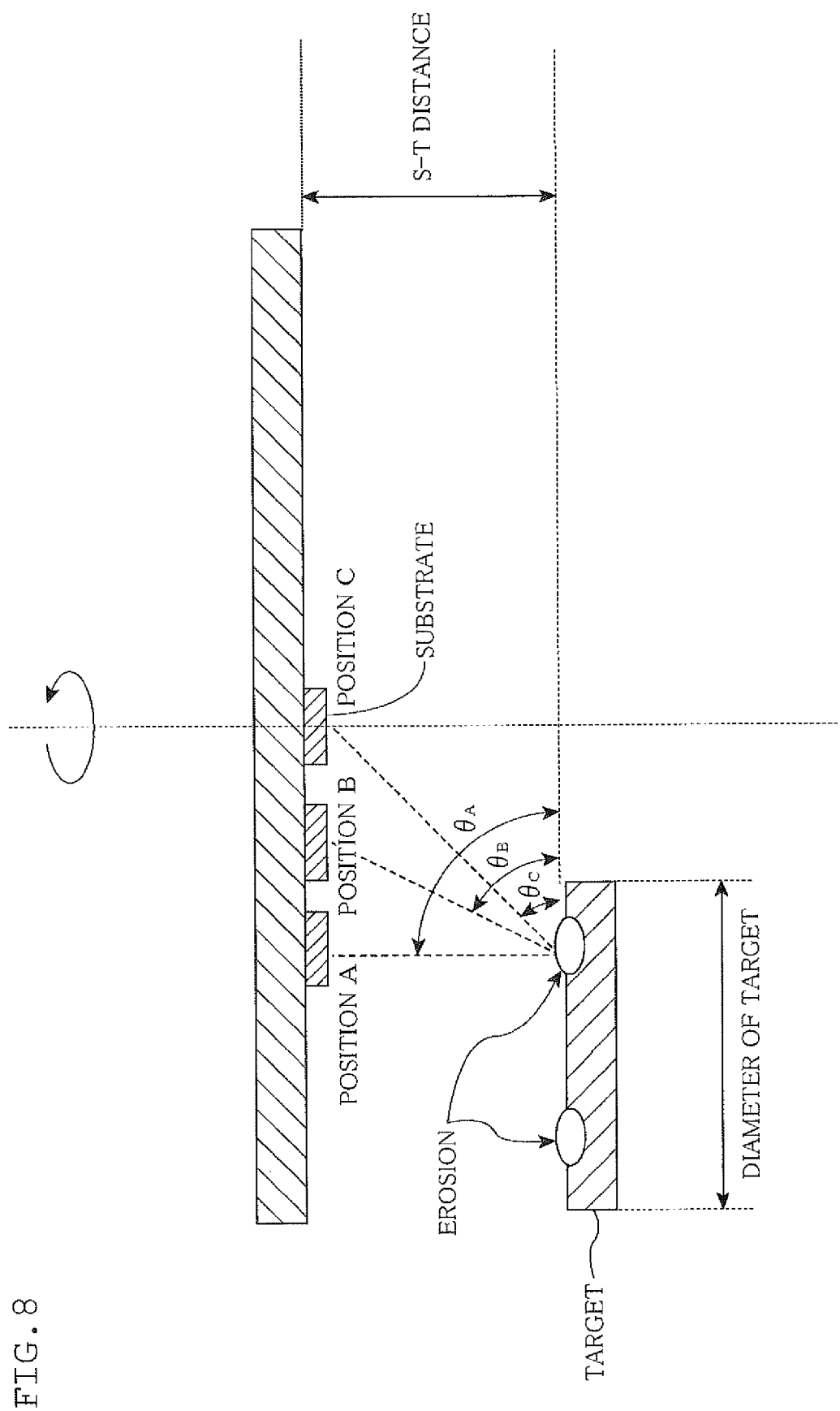
FIG. 8 shows a schematic diagram for explaining a relation between a target and the substrate position in Examples 14 to 16 and Comparative Examples 7 to 9.

Moreover, FIG. 8 shows a schematic diagram for explaining a relation between a target and a substrate position in Examples 14 to 16 and Comparative Examples 7 to 9.

In FIG. 8, a film forming position (the substrate position) was a position C. It is to be noted that in FIG. 8, θA=about 90°, θB=about 75°, and θC=about 55°.

Consequently, there was obtained a transparent conductive glass in which a transparent conductive oxide having a film thickness of about 100 nm was formed on the glass substrate.

Then, the obtained film composition was analyzed by an ICP method, and in consequence, the atomic ratio [In]/([In]+[Zn]) was 0.93, and the atomic ratio [Zn]/([In]+[Zn]) was 0.07.

(3) Oxidation Treatment of Semiconductor Thin Film

The transparent semiconductor thin film obtained in the above (2) was heated at 280° C. for two hours in the atmosphere (in the presence of oxygen) (the atmospheric heat treatment) to accomplish crystallization.

(4) Evaluation of Physical Properties of Transparent Semiconductor Thin Film

FIG. 9 shows graphs of the analysis results of X-ray crystal structures of polycrystalline oxide semiconductor thin films of Examples 14 and 15.

According to the analysis result of the X-ray crystal structure of the transparent semiconductor thin film obtained in the above (3), a clear peak appeared, and crystallinity was polycrystalline as shown in FIG. 9(a). Moreover, a half value width was 0.2°, and a diffraction intensity ratio (I(222)/I(400)) was less than 0.01.

Moreover, the carrier concentration and Hall mobility of the transparent semiconductor thin film were measured by a Hall measurement device. The carrier concentration was $4 \times 10^{14}$ cm$^{-3}$, and the Hall mobility was 8 cm$^2$/Vs. Moreover, the value of a specific resistance measured by a four terminal method was 2000 Ωcm.

The Hall measurement device and measurement conditions were as follows.

Hall Measurement Device

Resi Test 8310 manufactured by Toyo Corp.

Measurement Conditions

Room temperature (about 25° C.), about 0.5 [T], about $10^{-4}$ to $10^{-12}$ A, AC magnetic field Hall measurement Moreover, in Examples 14 to 16 and Comparative Examples 7 to 9, PAN resistance was also evaluated, and the results are shown in the table of FIG. 7.

PAN Resistance

The semiconductor thin films in which an etching speed by PAN was 10 nm/minute or more were denoted by x, and the other films were denoted by o in the table.

Here, for the evaluation of the PAN resistance, a PAN etching solution (about 91.4 wt % of phosphoric acid, about 3.3 wt % of nitric acid and about 5.3 wt % of acetic acid) at about 35° C. was used. It is to be noted that, in the PAN etching solution (the etching solution including phosphoric acid, nitric acid and acetic acid) which is usually used, phosphoric acid is in a range of about 45 to 95 wt %, nitric acid is in a range of about 0.5 to 5 wt %, and acetic acid is in a range of about 3 to 50 wt %.

The evaluation of this semiconductor thin film was that the PAN resistance was o in the table.

That is, the above polycrystalline semiconductor thin film of Example 14 had properties as an excellent transparent semiconductor thin film.

Properties of Thin-Film Transistor

Furthermore, with regard to the semiconductor thin films of Examples 14 to 16 and Comparative Examples 7 to 9, each thin-film transistor using an Si substrate as a gate electrode and having W=100 μm, L=100 μm was formed on the conductive Si substrate, and the mobility and on-off ratio of each transistor were measured and evaluated.

A thin-film transistor 2001 of the present example had a mobility of 35 cm$^2$/Vs and an on-off ratio of 10$^6$ or more, which meant that it had excellent transistor properties.

Moreover, the semiconductor thin films of Examples 15 and 16 and Comparative Examples 7 to 9 were produced and evaluated in the same manner as in Example 14 except that film composition atomic ratios, substrate positions, film forming conditions, oxidation treatment conditions and the like were regulated as shown in the table of FIG. 7.

Example 15

An oxide of Example 15 was produced under about the same producing conditions (a film forming process, a substrate position, film forming conditions, a film composition atomic ratio and a heat treatment) as in Example 14 except that the substrate position was moved from a position C to a position A.

With regard to the properties of the oxide produced under the above producing conditions, as shown in FIG. 7, a crystallinity was polycrystalline (see FIG. 9(b)), a half value width was 0.2°, a diffraction intensity ratio (I(222)/I(400)) was larger than 20, a carrier concentration was about 8×10$^{14}$ cm$^{-3}$, and a Hall mobility was about 5 cm$^2$/Vs. The value of a specific resistance measured by a four terminal method was about 1600 Ωcm. Furthermore, PAN resistance was denoted by o in the table. As transistor properties, though not shown in the drawing, a mobility was 25 cm$^2$/Vs, and an on-off ratio was 10$^6$ or more.

That is, the polycrystallized oxide of Example 15 described above had properties as an excellent transparent semiconductor thin film. Moreover, a thin-film transistor 2001 of Example 15 had excellent transistor properties.

Example 16

An oxide of Example 16 was produced under about the same producing conditions (a film forming process, a substrate position, film forming conditions, a film composition atomic ratio and a heat treatment) as in Example 14 except that Mg was added instead of Zn.

With regard to the properties of the oxide produced under the above producing conditions, as shown in FIG. 7, a crystallinity was polycrystalline, a half value width was 0.2°, a diffraction intensity ratio (I(222)/I(400)) was less than 0.01, a carrier concentration was about 6×10$^{14}$ cm$^{-3}$, and a Hall mobility was about 6 cm$^2$/Vs. The value of a specific resistance measured by a four terminal method was about 1800 Ωcm. Furthermore, PAN resistance was o in the drawing. As transistor properties, though not shown in the drawing, a mobility was 30 cm$^2$/Vs, and an on-off ratio was 10$^6$ or more.

That is, the polycrystallized oxide of Example 16 described above had properties as an excellent transparent semiconductor thin film. Moreover, a thin-film transistor 2001 of Example 16 had excellent transistor properties.

Comparative Example 7

An oxide of Comparative Example 7 was produced under about the same producing conditions (a film forming process, a substrate position, film forming conditions, a film composition atomic ratio and a heat treatment) as in Example 14 except that the substrate position was a position B, a film was formed at a substrate temperature of 270° C., a reached pressure was 10×10$^{-4}$ Pa, a sputtering pressure (the total pressure was 0.4 Pa, and any atmospheric heat treatment was not performed.

Figure 10:
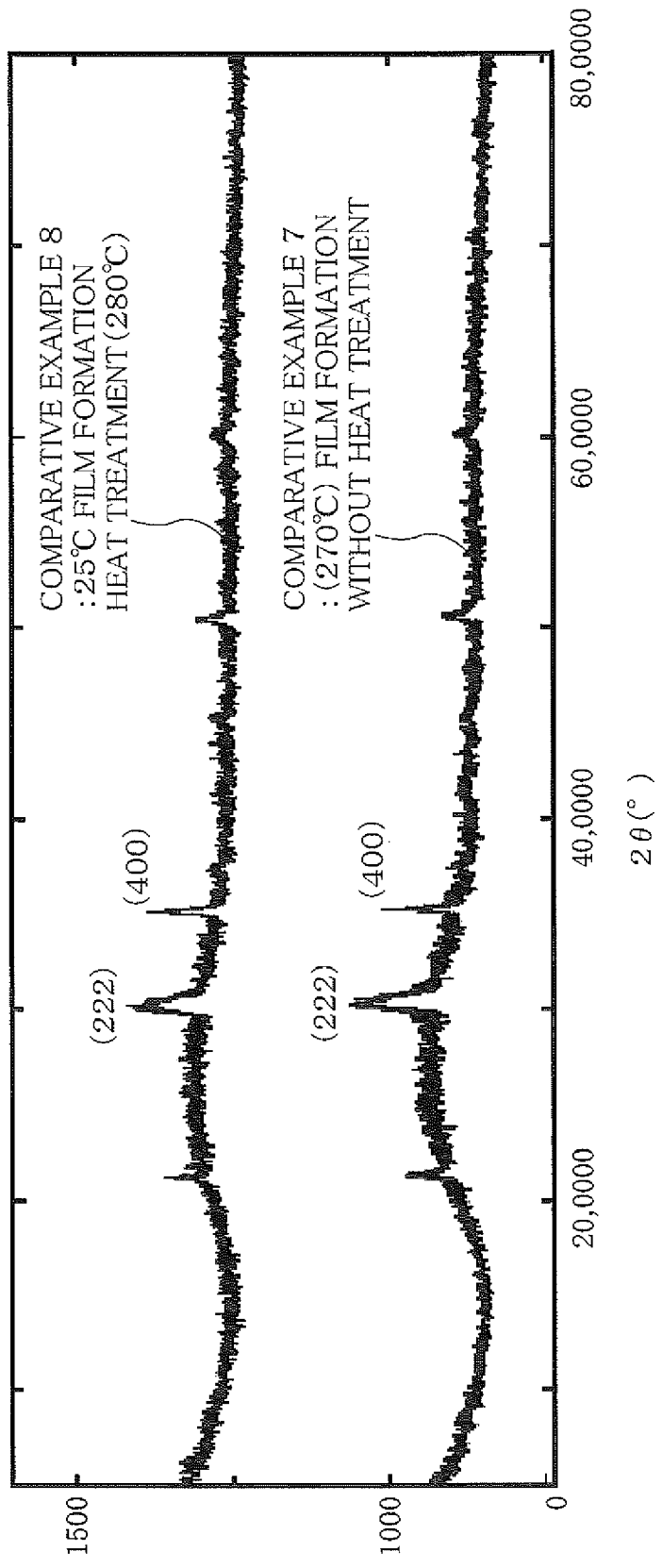
FIG. 10 shows graphs of the analysis results of X-ray crystal structures of polycrystalline oxide semiconductor thin films of Comparative Examples 7 and 8.

Moreover, FIG. 10 shows graphs of the analysis results of X-ray crystal structures of polycrystalline oxide semiconductor thin films of Comparative Examples 7 and 8.

With regard to the properties of the oxide produced under the above producing conditions, as shown in FIG. 7, a crystallinity was polycrystalline (see Comparative Example 7 of FIG. 10), a half value width was 1°, a diffraction intensity ratio (I(222)/I(400)) was 2, a carrier concentration was about 2×10$^{15}$ cm$^{-3}$, and a Hall mobility was about 1 cm$^2$/Vs. The value of a specific resistance measured by a four terminal method was about 3200 Ωcm. Furthermore, PAN resistance was denoted by o in the drawing. As transistor properties, though not shown in the drawing, a mobility was 8 cm$^2$/Vs, and an on-off ratio was 10$^5$ or more.

That is, the polycrystallized oxide of Comparative Example 7 described above had properties as a transparent semiconductor thin film, but the Hall mobility was low as compared with Examples 14 to 16. Moreover, a thin-film transistor of Comparative Example 7 had the transistor properties, but the mobility was low as compared with Examples 14 to 16.

Comparative Example 8

An oxide of Comparative Example 8 was produced under about the same producing conditions (a film forming process, a substrate position, film forming conditions, a film composition atomic ratio and a heat treatment) as in Comparative Example 7 except that the heat treatment was further performed at 280° C. for two hours in the atmosphere.

With regard to the properties of the oxide produced under the above producing conditions, as shown in FIG. 7, a crystallinity was polycrystalline (see Comparative Example 8 of FIG. 10), a half value width was 1°, a diffraction intensity ratio (I(222)/I(400)) was 2, a carrier concentration was about 9×10$^{14}$ cm$^{-3}$, and a Hall mobility was about 1 cm$^2$/Vs. The value of a specific resistance measured by a four terminal method was about 3500 Ωcm. Furthermore, PAN resistance was denoted by o. As transistor properties, though not shown in the drawing, a mobility was 10 cm$^2$/Vs, and an on-off ratio was 10$^5$ or more.

That is, the polycrystallized oxide of Comparative Example 8 described above had properties as a transparent semiconductor thin film, but the Hall mobility was low as compared with Examples 14 to 16. Moreover, a thin-film transistor of Comparative Example 8 had transistor properties, but the mobility was low as compared with Examples 14 to 16.

Comparative Example 9

An oxide of Comparative Example 9 was produced under about the same producing conditions (a film forming process, a substrate position, film forming conditions, a film composition atomic ratio and an oxidation treatment) as in Comparative Example 8 except that the substrate position was a position A, a reached pressure was 0.1×10$^{-4}$ Pa, an atomic ratio [In]/([In]+[Zn]) was 0.50, an atomic ratio [Zn]/([In]+[Zn]) was 0.50, and a heat treatment was performed at 280° C. for two hours in the atmosphere.

With regard to the properties of the oxide produced under the above producing conditions, as shown in FIG. 7, a crystallinity was amorphous, a carrier concentration was about $1 \times 10^{20}$ cm$^{-3}$, and a Hall mobility was about 20 cm$^2$/Vs. The value of a specific resistance measured by a four terminal method was about 0.003 Ωcm. Furthermore, PAN resistance was denoted by x. As transistor properties, though not shown in the drawing, a normally on state was seen, and any transistor properties could not be confirmed.

That is, the oxide of Comparative Example 9 described above did not have properties as a transparent semiconductor thin film.

The semiconductor device, the polycrystalline semiconductor thin film, the process for producing the polycrystalline semiconductor thin film, the field effect transistor and the process for producing the field effect transistor of the present invention have been described above with reference to preferable embodiments. However, the semiconductor device, the polycrystalline semiconductor thin film, the process for producing the polycrystalline semiconductor thin film, the field effect transistor and the process for producing the field effect transistor according to the present invention are not limited to the above embodiments only. Needless to say, various modifications can be performed within the scope of the present invention.

The semiconductor device may be, for example, a TFT substrate having a large area and used in a large-sized image display device.

Moreover, for example, the polycrystalline semiconductor thin film is not limited to a case where it is used in the active layer of the field effect transistor, and may be used as, for example, a semiconductor layer of the semiconductor device.

The invention claimed is:

1. A polycrystalline semiconductor thin film which contains indium, a positive bivalent element and oxygen,
   the thin film having a crystallinity with a locking curve half value width of 1° or less in an X-ray diffraction method, wherein crystals are aligned in a predetermined direction.

2. The polycrystalline semiconductor thin film according to claim 1, wherein an X-ray diffraction pattern in the X-ray diffraction method is the pattern of Vicks byte structure, and a diffraction intensity ratio (I(222)/I(400)) between a (222) peak intensity (I(222)) and a (400) peak intensity (4400)) is I(222)/I(400)<1.0.

3. The polycrystalline semiconductor thin film according to claim 1, wherein an X-ray diffraction pattern in the X-ray diffraction method is the pattern of Vicks byte structure, and a diffraction intensity ratio (I(222)/I(400)) between a (222) peak intensity (I(222)) and a (400) peak intensity (4400)) is I(222)/I(400)>10.

4. The polycrystalline semiconductor thin film according to claim 1, wherein a relation between the number (=[In]) of the atoms of indium and the number (=[X]) of the atoms of the positive bivalent element satisfies a ratio [X]/([X]+[In])= 0.0001 to 0.13.

5. The polycrystalline semiconductor thin film according to claim 1, wherein the positive bivalent element is one or more elements selected from the group consisting of zinc, magnesium, copper, cobalt, nickel, calcium and strontium.

6. The polycrystalline semiconductor thin film according to claim 1, which contains a positive tetravalent element in an amount smaller than that of the positive bivalent element.

7. The polycrystalline semiconductor thin film according to claim 1, which is insoluble in a phosphoric acid-based etching solution (PAN), and soluble in an oxalic acid-based etching solution.

8. A process for producing the polycrystalline semiconductor thin film according to claim 1, the process comprising:
   a step of forming an amorphous film at a substrate temperature of 150° C. or less; and
   a step of crystallizing the amorphous film at a temperature above 150° C. and not more than 500° C. to produce the polycrystalline semiconductor thin film.

9. A field effect transistor which uses, as an active layer, the polycrystalline semiconductor thin film according to claim 1.

10. A process for producing the field effect transistor according to claim 9, the process comprising:
    a step of forming an amorphous film as the active layer at a substrate temperature of 150° C. or less; and
    a step of crystallizing the amorphous film at a temperature above 150° C. and not more than 500° C. to produce the polycrystalline semiconductor thin film.

* * * * *

UNITED STATES PATENT AND TRADEMARK OFFICE
CERTIFICATE OF CORRECTION

PATENT NO.        : 8,158,974 B2
APPLICATION NO.   : 12/532259
DATED             : January 19, 2010
INVENTOR(S)       : Koki Yano et al.

It is certified that error appears in the above-identified patent and that said Letters Patent is hereby corrected as shown below:

Column 36, line 2 (Claim 2), reads: "peak intensity (I(222)) and a (400) peak intensity (4400)) is"
It should read: -- peak intensity (I(222)) and a (400) peak intensity (I(400)) is --.

Column 36, line 8 (Claim 3), reads: "peak intensity (I(222)) and a (400) peak intensity (4400)) is"
It should read: -- peak intensity (I(222)) and a (400) peak intensity (I(400)) is --.

Signed and Sealed this
Thirty-first Day of July, 2012

David J. Kappos
*Director of the United States Patent and Trademark Office*